(12) United States Patent
Lee et al.

(10) Patent No.: US 12,490,445 B2
(45) Date of Patent: Dec. 2, 2025

(54) FABRICATION METHOD OF FORMING SILICON CARBIDE MOSFET

(71) Applicant: PANJIT INTERNATIONAL INC., Kaohsiung (TW)

(72) Inventors: Seungchul Lee, San Jose, CA (US); Youngchul Choi, Santa Clara, CA (US); Chaohsin Huang, New Taipei (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 434 days.

(21) Appl. No.: 17/730,189

(22) Filed: Apr. 27, 2022

(65) Prior Publication Data
US 2023/0261085 A1  Aug. 17, 2023

Related U.S. Application Data

(63) Continuation of application No. 17/672,672, filed on Feb. 15, 2022.

(51) Int. Cl.
| | |
|---|---|
| *H01L 29/66* | (2006.01) |
| *H01L 21/3213* | (2006.01) |
| *H10D 12/01* | (2025.01) |
| *H10D 62/832* | (2025.01) |
| *H10D 64/01* | (2025.01) |
| *H10D 30/01* | (2025.01) |

(52) U.S. Cl.
CPC ..... *H10D 12/031* (2025.01); *H01L 21/32135* (2013.01); *H01L 21/32139* (2013.01); *H10D 62/8325* (2025.01); *H10D 64/01* (2025.01); *H10D 30/0293* (2025.01)

(58) Field of Classification Search
CPC ............ H01L 29/66068; H01L 29/401; H01L 21/32135
USPC ......................................................... 438/211
See application file for complete search history.

(56) References Cited

U.S. PATENT DOCUMENTS

| | | | |
|---|---|---|---|
| 2002/0050629 A1* | 5/2002 | Seshan | H01L 23/3192 257/632 |
| 2010/0301410 A1* | 12/2010 | Hirler | H01L 29/7397 257/334 |
| 2012/0153303 A1* | 6/2012 | Uchida | H01L 29/41766 257/77 |

(Continued)

OTHER PUBLICATIONS

English Machine Translation of CN212517214 (Year: 2021).*

*Primary Examiner* — Dzung Tran

(57) ABSTRACT

A fabrication method of forming a silicon carbide MOSFET is provided. The fabrication method includes the step of providing a semiconductor substrate. A P-well region is formed by implanting the semiconductor substrate through the P-well mask. A spacer is disposed on sidewall of the P-well mask and the P-well region is implanted to form an N-plus layer. A P-plus mask is disposed on the semiconductor substrate and the semiconductor substrate is implanted to form a P-plus layer. A gate oxide layer, a poly gate and a first interlayer dielectric layer are formed on the semiconductor substrate. A second interlayer dielectric layer is disposed on sidewall of the poly gate and the first interlayer dielectric layer. A metal layer is disposed to cover the first interlayer dielectric layer and the second interlayer dielectric layer.

9 Claims, 25 Drawing Sheets

(56) References Cited

U.S. PATENT DOCUMENTS

| | | | |
|---|---|---|---|
| 2013/0280897 A1* | 10/2013 | Tamura | H01L 29/7848 |
| | | | 438/527 |
| 2016/0027910 A1* | 1/2016 | Uchida | H01L 29/66068 |
| | | | 257/77 |
| 2016/0086844 A1* | 3/2016 | Berger | C30B 25/186 |
| | | | 438/458 |
| 2017/0025524 A1* | 1/2017 | Kinoshita | H01L 29/1079 |
| 2020/0020798 A1* | 1/2020 | Deng | H01L 29/404 |
| 2020/0373393 A1* | 11/2020 | Uchida | H01L 29/0619 |

* cited by examiner

FABRICATION METHOD OF FORMING SILICON CARBIDE MOSFET

CROSS-REFERENCE TO RELATED APPLICATION

This application is a continuation application of U.S. patent application Ser. No. 17/672,672, filed on Feb. 15, 2022, in the United States Patent and Trademark Office, the disclosure of which is incorporated herein in its entirety by reference.

BACKGROUND OF THE INVENTION

1. Field of the Invention

The present invention generally relates to a fabrication method of forming a silicon carbide MOSFET (Metal Oxide semiconductor Field Effect transistor), and in particular, to a new fabrication method including a dimple etching process and a new contact formation process for forming the silicon carbide MOSFET.

2. Description of the Related Art

The metal oxide semiconductor field effect transistor (MOSFET) device is one of the power semiconductor device frequently used in the power circuit or power chip. For forming the MOSFET device, the silicon carbide (SiC) is an attractive material used in the manufacturing process. Since the silicon carbide has good breakdown strength, the power device using silicon carbide may provide high withstand voltage and low voltage drop. The material properties like high electron mobility may provide good switching speed. Therefore, the MOSFET device made with silicon carbide may have good performance in electrical properties As the design of the electronic devices gets smaller and smaller, the power semiconductor device needs to reduce the cell size. In the conventional fabrication process for forming the silicon carbide MOSFET, the different mask layers are used to define the different regions in the power semiconductor device. However, the design margin for mis-alignment in the conventional process may cause the size restrictions. The more masks used in the process, the cell pitch won't be able to reduce. In addition, the number of the mask layers may directly affect the process steps. For example, the manufacturing cost and the complexity of the fabrication process cannot be reduced. Therefore, the conventional fabrication process of forming the silicon carbide MOSFET still has some considerable problems.

In summary, the conventional fabrication method to the silicon carbide MOSFET still has considerable problems. Hence, the present disclosure provides the fabrication method of forming the silicon carbide MOSFET to resolve the shortcomings of conventional technology and promote industrial practicability

SUMMARY OF THE INVENTION

In view of the aforementioned technical problems, the primary objective of the present disclosure is to provide a fabrication method of forming a silicon carbide MOSFET, which is capable of forming the silicon carbide MOSFET with smaller cell pitch and reducing the number of the mask used in the fabrication process.

In accordance with one objective of the present disclosure, a fabrication method of forming a silicon carbide MOSFET is provided. The fabrication method includes the following steps of: providing a semiconductor substrate, the semiconductor substrate having a silicon carbide layer; providing a P-well mask on the semiconductor substrate and implanting the semiconductor substrate through the P-well mask to form a P-well region; disposing a spacer on sidewall of the P-well mask and implanting the P-well region through the spacer to form an N-plus layer; removing the P-well mask and the spacer; disposing a P-plus mask on the semiconductor substrate and implanting the semiconductor substrate through the P-plus mask to form a P-plus layer; removing the P-plus mask and disposing a gate oxide layer on the semiconductor substrate by an oxidation process; disposing a polysilicon layer and a dielectric layer, the polysilicon layer being disposed on the gate oxide layer and the dielectric layer being disposed on the polysilicon layer; etching the polysilicon layer and the dielectric layer to define a poly gate and a first interlayer dielectric layer; disposing a second interlayer dielectric layer on sidewall of the poly gate and the first interlayer dielectric layer; disposing a metal layer to cover the first interlayer dielectric layer and the second interlayer dielectric layer.

Preferably, a junction field effect transistor layer may be formed on the silicon carbide layer by a junction field effect transistor implant.

Preferably, a P-well mask layer may be disposed on the silicon carbide layer and the P-well mask layer is etched to form the P-well mask.

Preferably, the metal layer may contact both the N-plus layer and the P-plus layer in a same plane.

Preferably, the P-plus layer and the N-plus layer may be disposed within the P-well region.

Preferably, the silicon carbide layer may be disposed on an oxide layer.

Preferably, a backside process may be conducted to remove the oxide layer after removing the P-well mask and the spacer.

Preferably, an anneal process may be conducted after every implant process.

Preferably, the first interlayer dielectric layer and the second interlayer dielectric may comprise same dielectric material.

Preferably, the first interlayer dielectric layer may comprise oxide dielectric material and the second interlayer dielectric layer may comprise nitride dielectric material.

Preferably, a passivation deposition process may be conducted after disposing a metal layer.

In accordance with one objective of the present disclosure, a fabrication method of forming a silicon carbide MOSFET is provided. The fabrication method includes the following steps of: providing a semiconductor substrate, the semiconductor substrate having a silicon carbide layer and the silicon carbide layer being disposed on an oxide layer; forming a junction field effect transistor layer on the silicon carbide layer; providing a P-well mask on the junction field effect transistor layer and implanting the semiconductor substrate through the P-well mask to form a P-well region; disposing a spacer on sidewall of the P-well mask and implanting the P-well region through the spacer to form an N-plus layer; removing the P-well mask and the spacer; disposing a P-plus mask on the semiconductor substrate and implanting the semiconductor substrate through the P-plus mask to form a P-plus layer; removing the P-plus mask and conducting a backside process to remove the oxide layer; disposing a gate oxide layer, a polysilicon layer and a dielectric layer, the gate oxide layer being disposed on the semiconductor substrate, the polysilicon layer being disposed on the gate oxide layer and the dielectric layer being disposed on the polysilicon layer; etching the polysilicon layer and the dielectric layer to define a poly gate and a first interlayer dielectric layer; disposing a second interlayer dielectric layer on sidewall of the poly gate and the first interlayer dielectric layer; disposing a metal layer, the metal layer covering the first interlayer dielectric layer and the second interlayer dielectric layer.

Preferably, a junction field effect transistor implant may be conducted to form the junction field effect transistor layer on the silicon carbide layer.

Preferably, a P-well mask layer may be disposed on the junction field effect transistor layer and the P-well mask layer may be etched to form the P-well mask.

Preferably, the metal layer may contact both the N-plus layer and the P-plus layer in a same plane.

Preferably, the P-plus layer and the N-plus layer may be disposed within the P-well region.

Preferably, an anneal process may be conducted after every implant process.

Preferably, the first interlayer dielectric layer and the second interlayer dielectric may comprise same dielectric material.

Preferably, the first interlayer dielectric layer may comprise oxide dielectric material and the second interlayer dielectric layer may comprise nitride dielectric material.

Preferably, a passivation deposition process may be conducted after disposing a metal layer.

As mentioned previously, the fabrication method of forming a silicon carbide MOSFET in accordance with the present disclosure may have one or more advantages as follows.

1. The fabrication method of forming a silicon carbide MOSFET is capable of reducing the number of the mask used in the fabrication process, so as to reduce the process complexity and to secure the process stability.

2. The fabrication method of forming a silicon carbide MOSFET may enable the smaller cell pitch of the silicon carbide MOSFET device, and the proposed process may make lower specific on-resistance device based on the reduction of the cell pitch.

3. The fabrication method of forming a silicon carbide MOSFET may use the original mask without adding new mask layer. The fabrication process may be easily achieved and the production cost can be reduced.

BRIEF DESCRIPTION OF THE DRAWINGS

The technical features, detail structures, advantages and effects of the present disclosure will be described in more details hereinafter with reference to the accompanying drawings that show various embodiments of the invention as follows.

DETAILED DESCRIPTION OF THE PREFERRED EMBODIMENTS

Figure 1A:
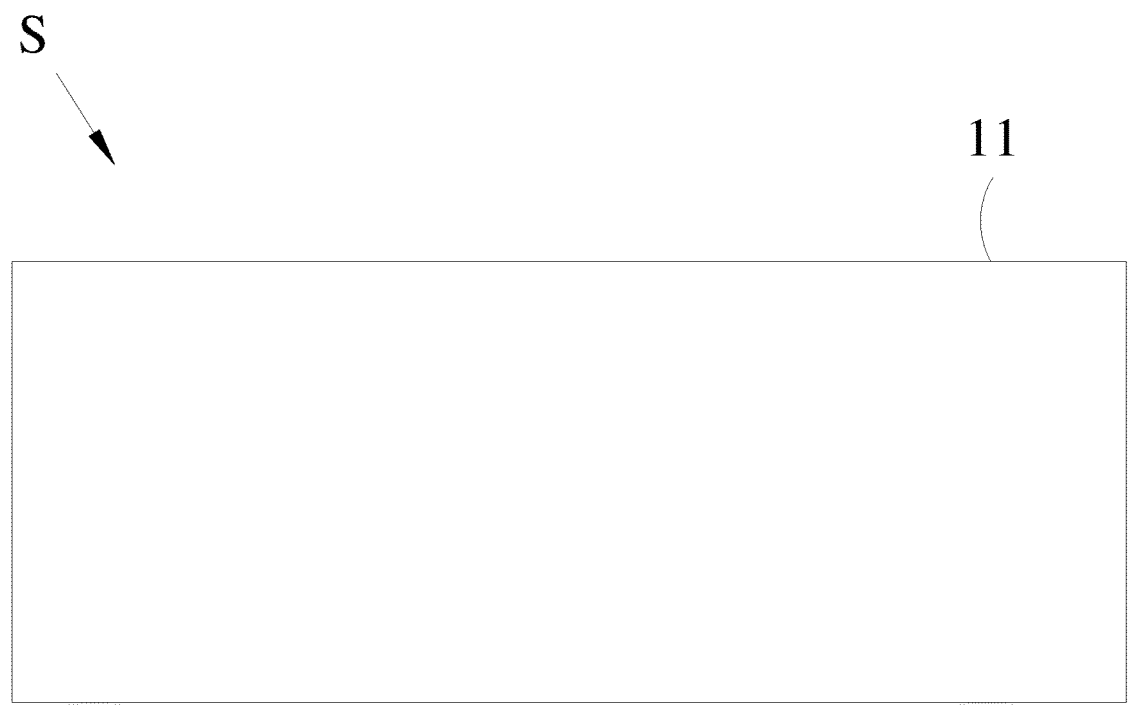
FIG. 1A to FIG. 1H are schematic diagrams of the fabrication process of forming the silicon carbide MOSFET in accordance with the first embodiment of the present disclosure.

In order to facilitate the understanding of the technical features, the contents and the advantages of the present disclosure, and the effectiveness thereof that can be achieved, the present disclosure will be illustrated in detail below through embodiments with reference to the accompanying drawings. The diagrams used herein are merely intended to be schematic and auxiliary to the specification, but are not necessary to be true scale and precise to the configuration after implementing the present disclosure. Thus, it should not be interpreted in accordance with the scale and the configuration of the accompanying drawings to limit the scope of the present disclosure on the practical implementation.

As those skilled in the art would realize, the described embodiments may be modified in various different ways. The exemplary embodiments of the present disclosure are for explanation and understanding only. The drawings and description are to be regarded as illustrative in nature and not restrictive. Similar reference numerals designate similar elements throughout the specification.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

Please refer to FIG. 1A to FIG. 1H, which are the schematic diagrams of the fabrication process of forming the silicon carbide MOSFET in accordance with the first embodiment of the present disclosure. FIG. 1A to FIG. 1H show the section view of the MOSFET device.

In FIG. 1A, the fabrication process provides a semiconductor substrate S, the semiconductor substrate S has a silicon carbide layer 11. Firstly, a silicon wafer is provided. A photoresist can be used to define the alignment mark. The silicon carbide layer 11 is formed by a dry etching process and the photo resistor will be removed. The silicon carbide layer 11 may be an n-drift region. In the other embodiment, the silicon carbide layer 11 may be disposed on the oxide layer.

Figure 1B:
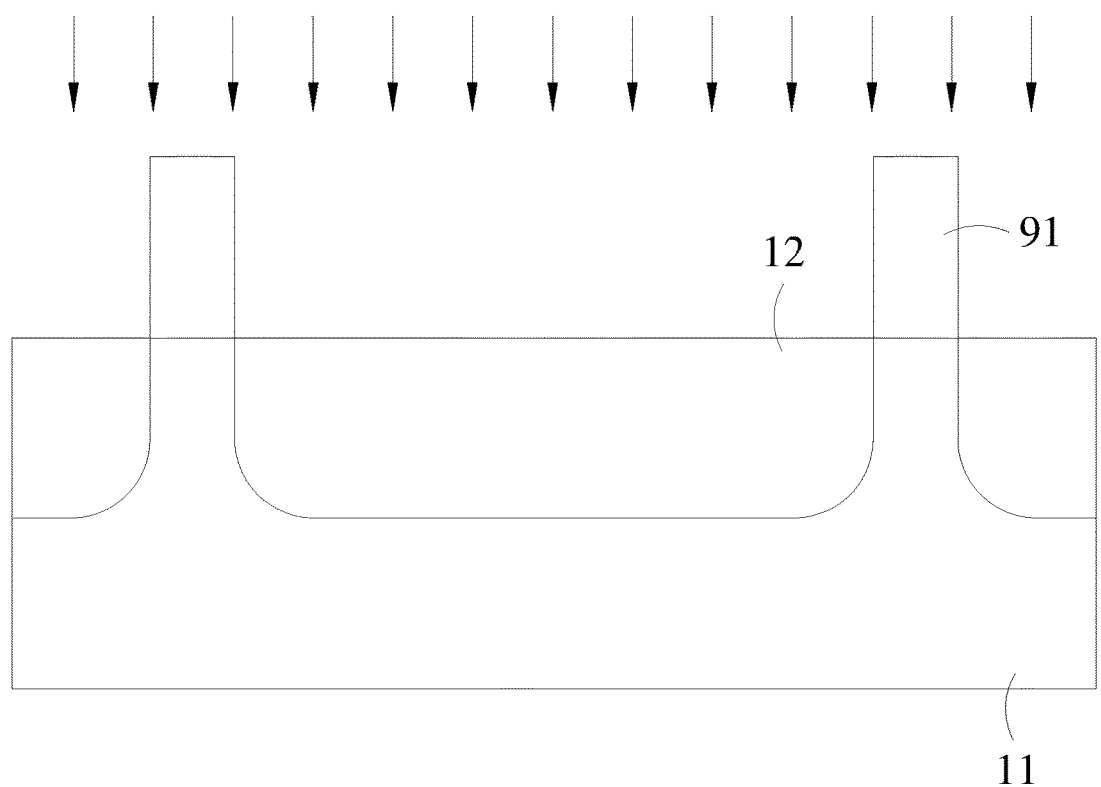

In FIG. 1B, the fabrication process provides a P-well mask 91 on the semiconductor substrate and implants the semiconductor substrate S through the P-well mask 91 to form a P-well region 12. In order to provide the P-well mask 91, a P-well mask layer can be disposed on the silicon carbide layer 11. Etching the P-well mask layer through the photoresist to form the P-well mask 91. The P-well mask 91 is used to define the area of the implant region. The fabrication process implants the semiconductor substrate S to form the P-well region 12. That is, the area of the silicon carbide layer 11 defined by the P-well mask 91 is implanted by the dopants to form the P-well region 12.

Figure 1C:
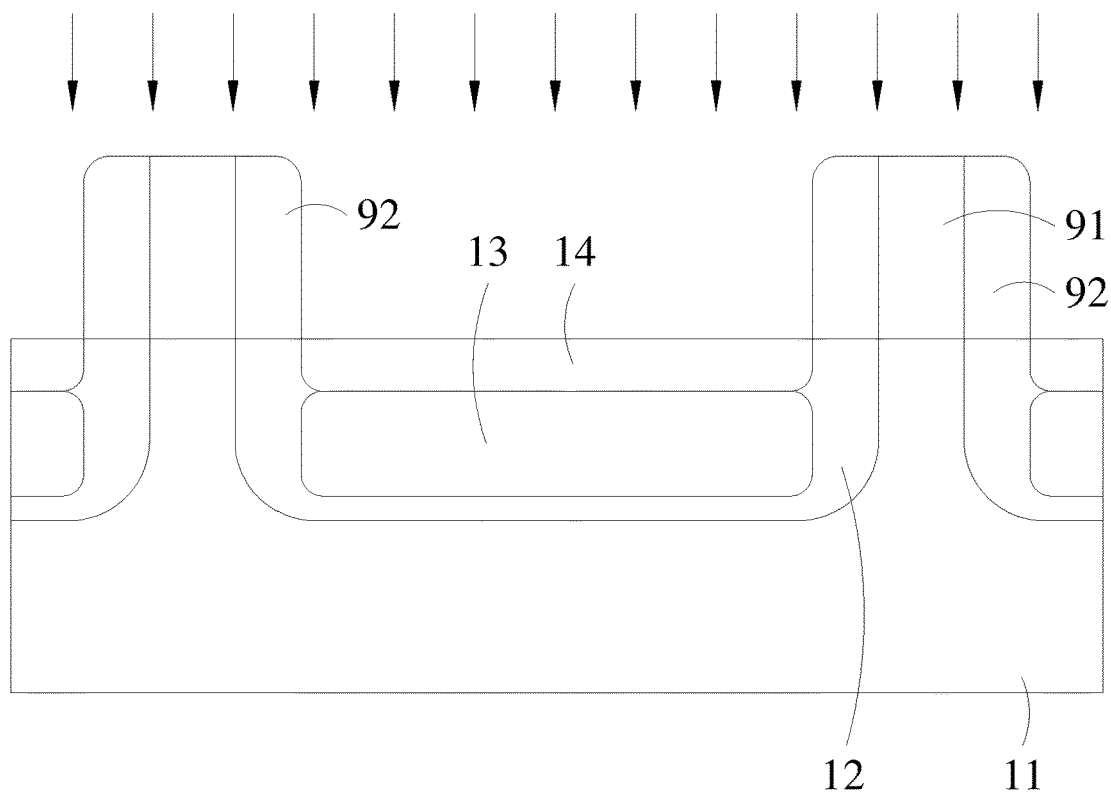

In FIG. 1C, the fabrication process disposes a spacer 92 on sidewall of the P-well mask 91 and implants the P-well region 12 through the spacer 92 to form a P-plus layer 13 and an N-plus layer 14, the N-plus layer 14 is disposed on the P-plus layer 13. After forming the P-well region 12, the next step is forming the highly doped regions. In the present disclosure, the spacers 92 are disposed on the sidewall of the p-well mask 91. These spacers 92 may be formed by a dielectric deposition process. For example, the dielectric material used in the deposition process may be silicon dioxide, silicon nitride ($Si_3N_4$), and so on. The spacers 92 cover the surrounding surface of the P-well region 12 and the exposed surface of the P-well region 12 may define the doped region. The ions are implanted into the P-well region 12 to form the P-plus layer 13 and the N-plus layer 14. The P-plus layer 13 and the N-plus layer 14 may be disposed within the P-well region 12.

The P-plus ions are implanted first to form the P-plus layer 13. Then the N-plus ions are implanted to form the N-plus layer 14 on the P-plus layer 13. The implant energy used for P-plus implantation is higher than the power used for N-plus implantation. Thus, the P-plus layer 13 may reach the deeper depth than the N-plus layer 14. The P-well mask 91 and the spacer 92 can be used as the same mask for forming both the P-plus layer 13 and the N-plus layer 14. The P-plus layer 13 and the N-plus layer 14 are overlapped and made by the self-align process. There is no need to prepare the different masks for different types of implant regions. Therefore, the manufacturing cost can be reduced. In addition, since the fabrication process can be simplified without arranging new mask, the manufacturing tolerance can be improved. That is, the pitch distance between the elements can be reduced and the size of the MOSFET device can be reduced accordingly.

Figure 1D:
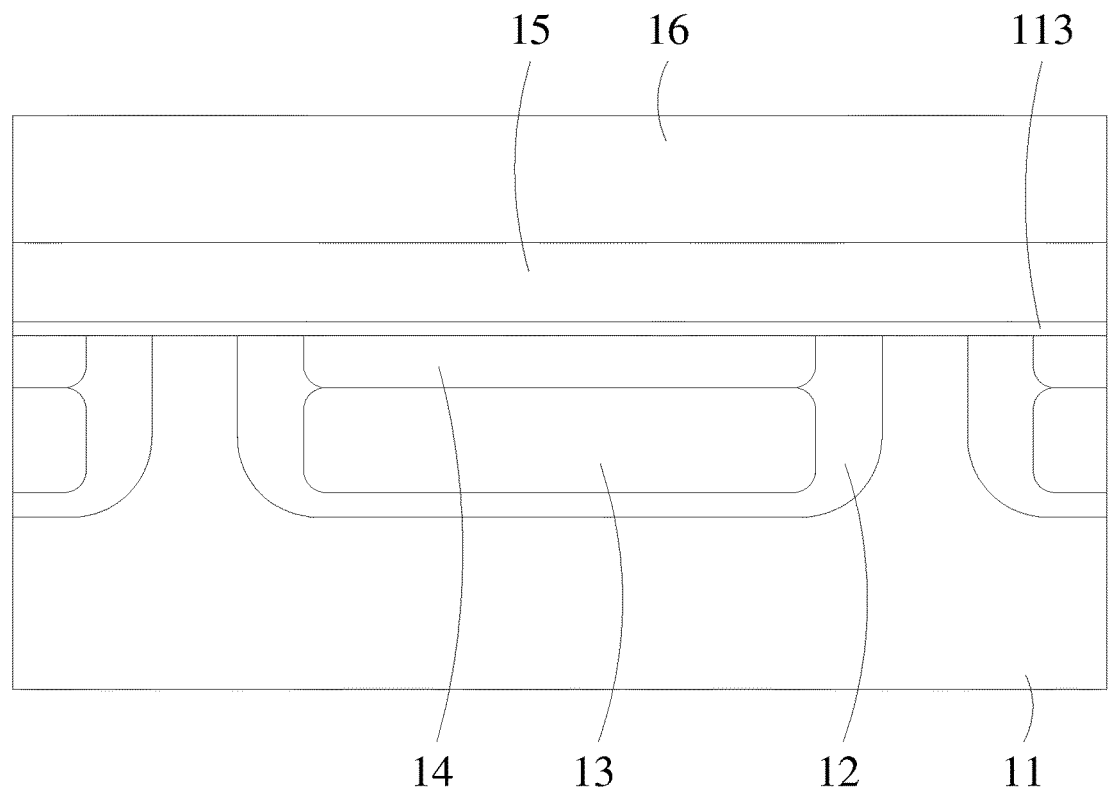

In FIG. 1D, the fabrication process removes the P-well mask 91 and the spacer 92 and disposing a gate oxide layer 113 on the semiconductor substrate S by an oxidation process. The fabrication process disposes a polysilicon layer 15 and a dielectric layer 16, the polysilicon layer 15 is disposed on the gate oxide layer 113 and the dielectric layer 16 is disposed on the polysilicon layer 15. After forming the P-plus layer 13 and the N-plus layer 14, the hard masks including the P-well mask 91 and the spacer 92 are removed. An oxidation process and an anneal process can be conducted to the surface of the semiconductor substrate S. The anneal process may include a high temperature anneal process over 1500° C., for example at 1700° C. If the silicon carbide layer is disposed on the oxide layer, a backside process may be conducted to remove the oxide layer.

When the surface of the semiconductor substrate S is cleaned, the gate oxide layer 113 is thermally grown on the surface of the semiconductor substrate S and treated to reduce interface trap densities on interface between the gate oxide layer 113 and the surface of the semiconductor substrate S. After that, the polysilicon layer 15 is disposed on the gate oxide layer 113 and the dielectric layer 16 is disposed on the polysilicon layer 15. The polysilicon layer 15 is formed by the poly deposition and the dielectric layer 16 is formed by the dielectric material deposition. The dielectric material may include oxide dielectric material, like silicon oxide.

Figure 1E:
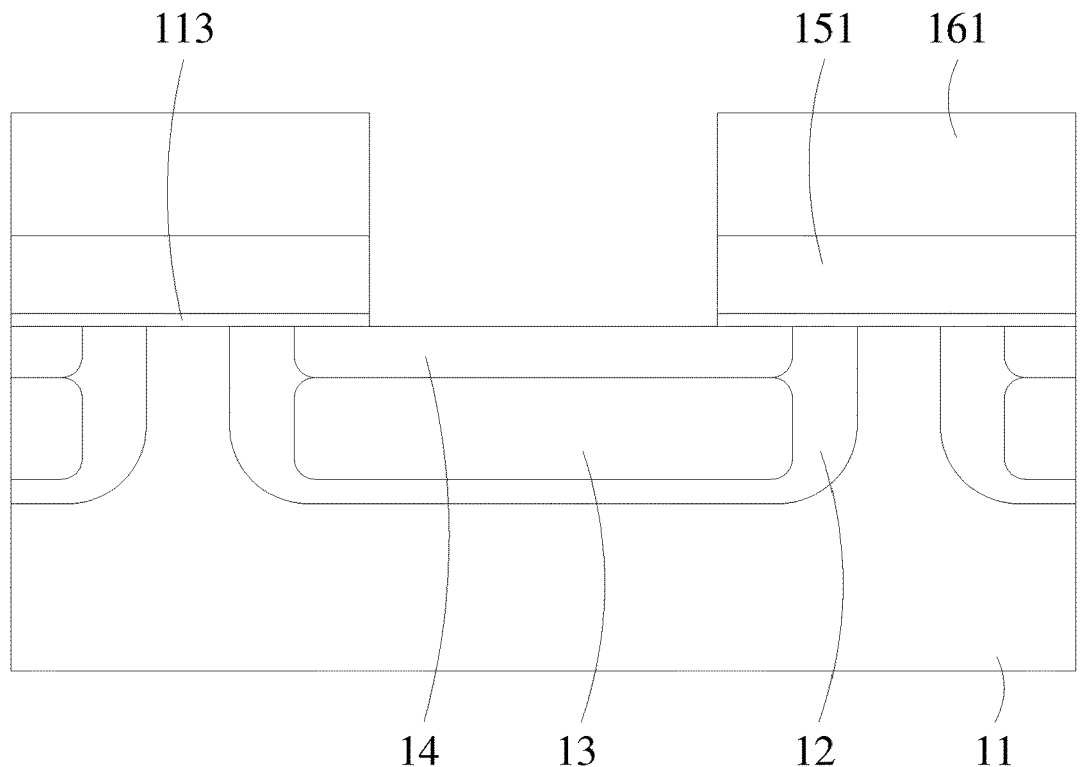

In FIG. 1E, the fabrication process etches the polysilicon layer 15 and the dielectric layer 16 to define a poly gate 151 and a first interlayer dielectric layer 161. In order to define the gate structure, the dielectric layer 16 and the polysilicon layer 15 are etched to define the patterned position of the poly gate 151. The poly gate 151 is disposed on partial area of the highly doped regions and is isolated from the highly doped regions by the gate oxide layer 113. The remained dielectric layer 16 may be the first interlayer dielectric layer 161 covering the top surface of the poly gate 151. The etching processes for forming the poly gate 151 and a first interlayer dielectric layer 161 may use the same mask. There is no need to provide a mask for defining the gate structure and another mask for forming the contact structure. Therefore, the numbers of the mask used in the fabrication process can be further reduced.

Figure 1F:
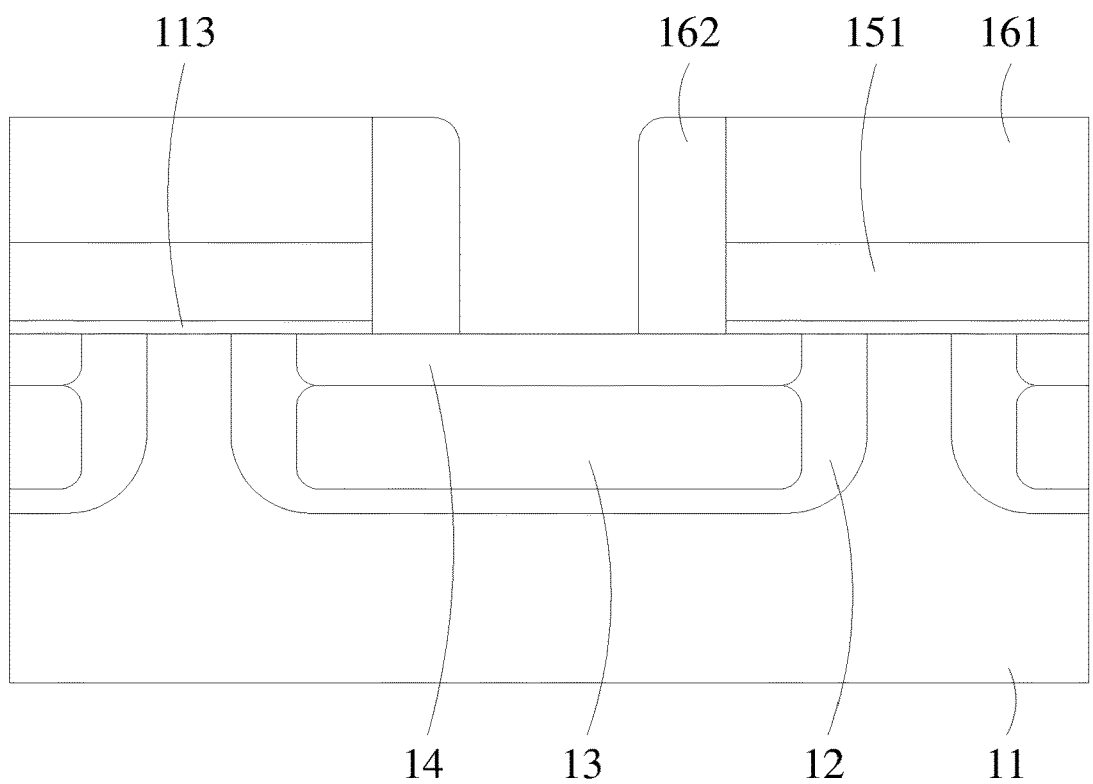

In FIG. 1F, the fabrication process disposes a second interlayer dielectric layer 162 on sidewall of the poly gate 151 and the first interlayer dielectric layer 161. Since the dielectric layer 16 and the polysilicon layer 15 are sequentially etched, the side surfaces of the poly gate 151 and the first interlayer dielectric layer 161 are exposed. To prevent contact with the poly gate 151, the second interlayer dielectric layer 162 is formed on the sidewall of the poly gate 151 and the first interlayer dielectric layer 161. The second interlayer dielectric layer 162 can be formed by the dielectric material deposition. The poly gate 151 is covered by the first interlayer dielectric layer 161 and the second interlayer dielectric layer 162.

In the present disclosure, the first interlayer dielectric layer 161 and the second interlayer dielectric layer 162 can be made by the different dielectric materials. For example, the first interlayer dielectric layer 161 may include oxide dielectric material and the second interlayer dielectric layer 162 may include nitride dielectric material. The different materials may have different etching rate. The reason of using different materials is to make sure that the thickness of the dielectric layer after the following etching process is still enough and the breakout route won't be occurred at the corner between the gate structure and the contact structure. However, the present disclosure is not restricted by the above material. In the other embodiment, the first interlayer dielectric layer 161 and the second interlayer dielectric layer 162 may use the same dielectric material, like silicon dioxide, silicon nitride or other dielectric material. The thickness of the dielectric layer can be achieved by controlling the etching time.

Figure 1G:
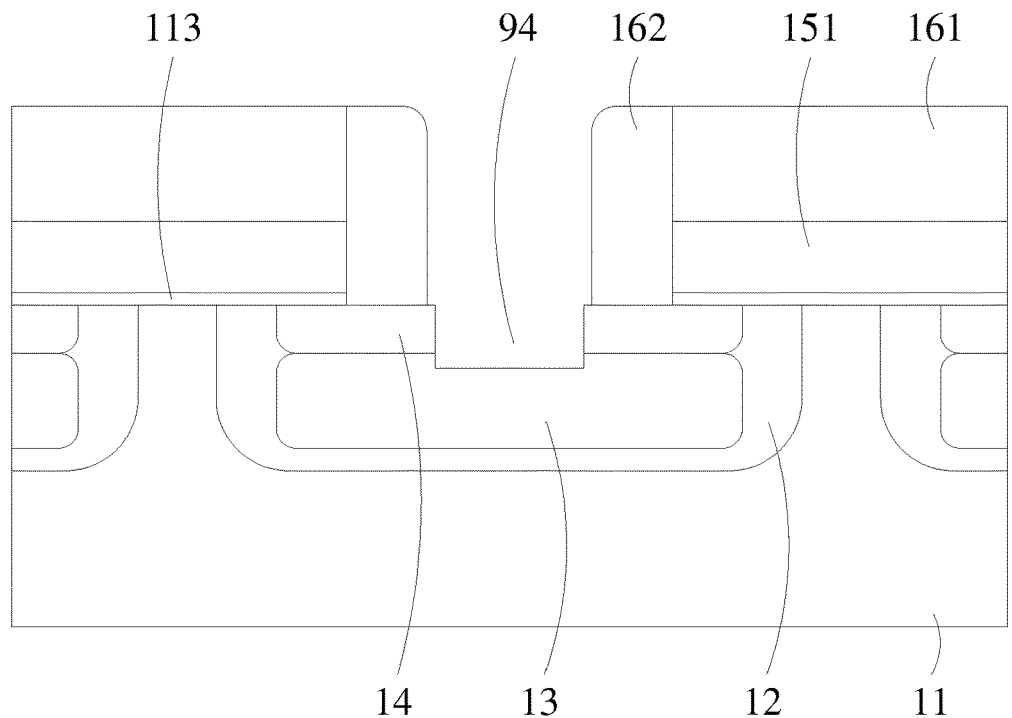

In FIG. 1G, the fabrication process etches the N-plus layer 14 to form an opening 94, the opening 94 exposes the P-plus layer 13. To make the MOSFET device work functionally, the contact structure must contact both the P-plus region and the N-plus region. However, the P-plus layer 13 is covered by the N-plus layer 14. In order to form the contact structure and to contact the both regions, the etching process is conducted to the N-plus layer 14 to form the opening 94. The etching process may use the second interlayer dielectric layer 162 as the hard mask. The opening 94 reaches over the depth of the N-plus layer 14 and exposes the P-plus layer 13.

As shown in FIG. 1G, the opening 94 can be formed by a dimple dry etch process to the semiconductor substrate S. The dimple structure means the etched semiconductor area in contact area. In the present disclosure, the shape of the dimple structure is rectangular. However, the present disclosure is not limited on the present embodiment. In the other embodiment, the shape of the dimple structure may be trapezoid or rounded, which can be varied according to sidewall shape of etched area. The dimple structure exposes the region of the P-plus layer 13.

Figure 1H:
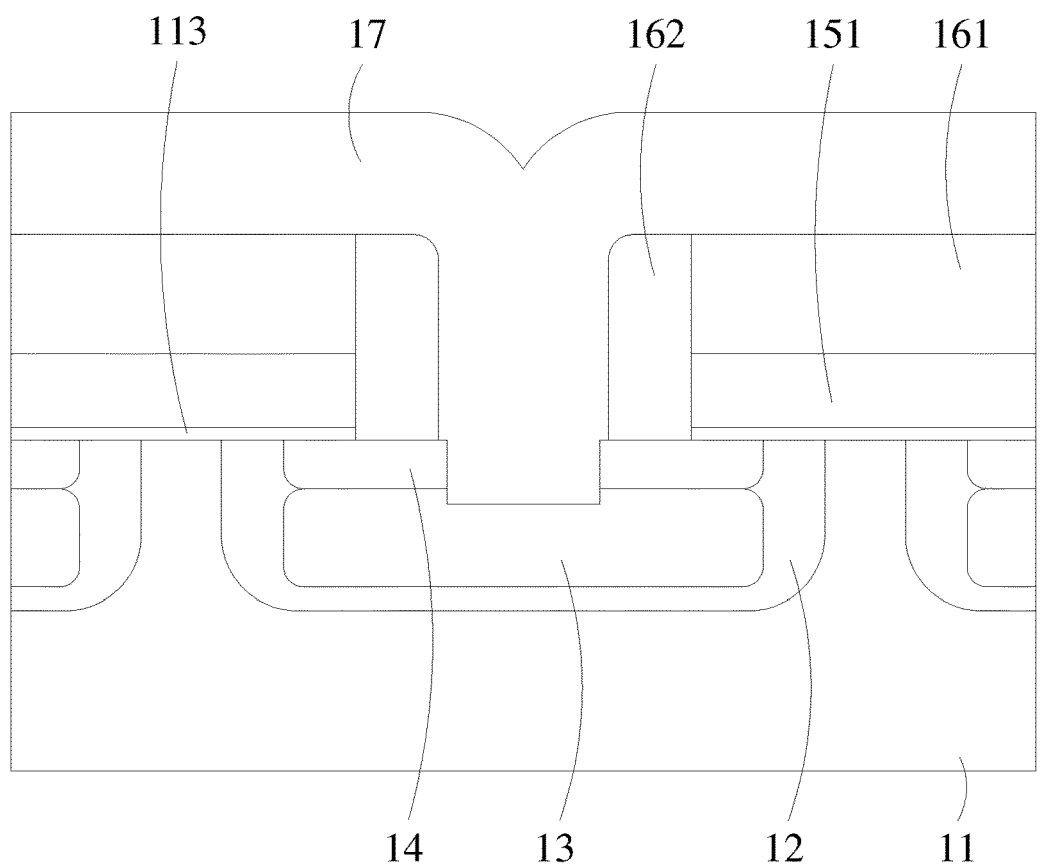

In FIG. 1H, the fabrication process disposes a metal layer 17 to cover the opening 94, the first interlayer dielectric layer 161 and the second interlayer dielectric layer 162. After forming the opening 94, the conductive material is filled in the opening 94 and covered the dielectric layer to form the metal layer 17. The metal layer 17 contacts both the N-plus layer 14 and the P-plus layer 13. The poly gate 151 is covered by the first interlayer dielectric layer 161 and the second interlayer dielectric layer 162. Thus, the poly gate 151 is isolated from the metal layer 17. A passivation deposition process may be conducted after disposing the metal layer 17.

FIG. 1H shows the schematic diagrams of the silicon carbide MOSFET in accordance with the first embodiment of the present disclosure. As shown in FIG. 1H, the silicon carbide MOSFET includes the silicon carbide layer 11, the P-well region 12, the P-plus layer 13, the N-plus layer 14, the gate oxide layer 113, the poly gate 151, the first interlayer dielectric layer 161, the second interlayer dielectric layer 162 and the metal layer 17. The P-well region 12 is disposed in the silicon carbide layer 11. The N-plus layer 14 is disposed on the P-plus layer 13. The P-plus layer 13 and the N-plus layer 14 are disposed within the P-well region 12. The poly gate 151 is disposed on the gate oxide layer 113 and the doped regions. That is, the poly gate 151 is overlapped on partial area of the P-well region 12 and the N-plus layer 14.

The first interlayer dielectric layer 161 is disposed on the poly gate 151 and covers the top surface of the poly gate 151. The second interlayer dielectric layer 162 is disposed on side surface of the poly gate 151. The first interlayer dielectric layer 161 and the second interlayer dielectric layer 162 can be made by dielectric implant process. The materials used for forming the first interlayer dielectric layer 161 and the second interlayer dielectric layer 162 can be same or different. The opening is formed between the two second interlayer dielectric layers 162 and the opening exposes the P-plus layer 13. The metal layer 17 is disposed in the opening and the metal contact is able to reach both the P-plus layer 13 and the N-plus layer 14. The metal layer 17 is also disposed on the first interlayer dielectric layer 161 and the second interlayer dielectric layer 162. The metal layer 17 and the poly gate 151 are isolated by the first interlayer dielectric layer 161 and the second interlayer dielectric layer 162.

Please refer to FIG. 2A to FIG. 2H, which are the schematic diagrams of the fabrication process of forming the silicon carbide MOSFET in accordance with the second embodiment of the present disclosure. FIG. 2A to FIG. 2H show the section view of the MOSFET device.

Figure 2A:
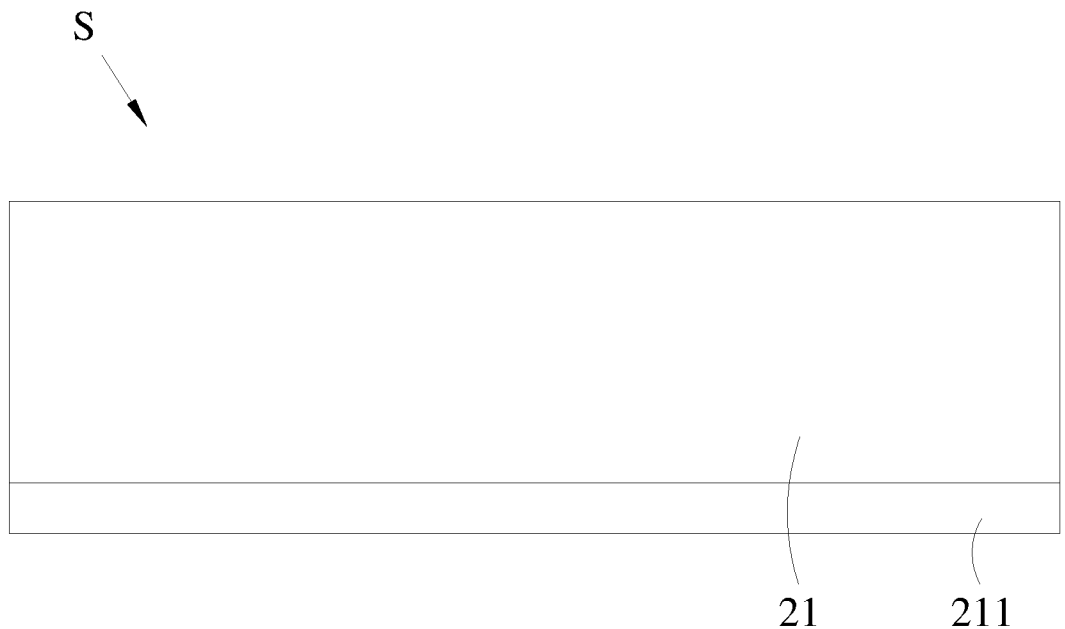
FIG. 2A to FIG. 2H are schematic diagrams of the fabrication process of forming the silicon carbide MOSFET in accordance with the second embodiment of the present disclosure.

In FIG. 2A, the fabrication process provides a semiconductor substrate S, the semiconductor substrate S having a silicon carbide layer 21 and the silicon carbide layer 21 is disposed on an oxide layer 211. A silicon wafer is provided. A photoresist can be used to define the alignment mark. The silicon carbide layer 21 is formed by a dry etching process and the photo resistor will be removed. The silicon carbide layer 21 may be an n-drift region.

Figure 2B:
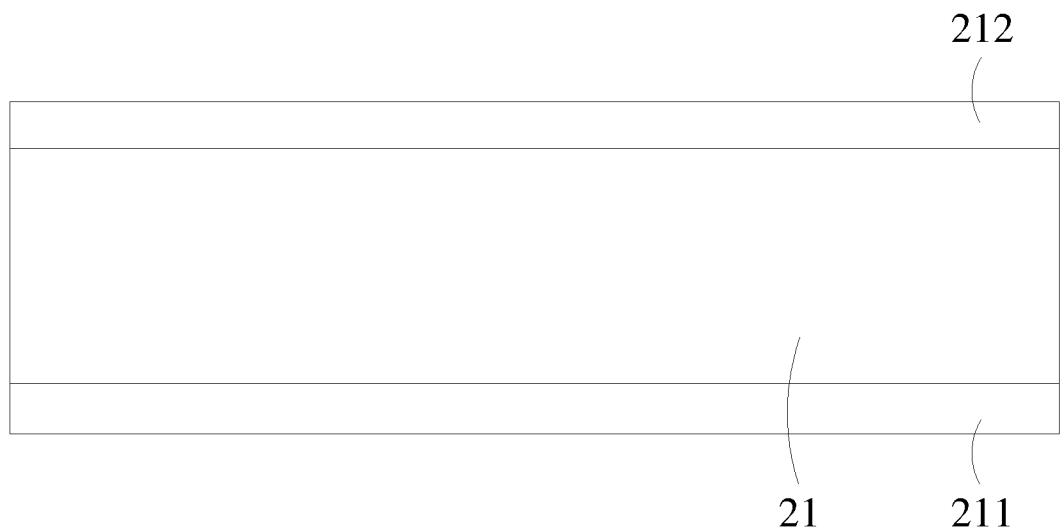

In FIG. 2B, the fabrication process forms a junction field effect transistor layer 212 on the silicon carbide layer 21. The all active are of the silicon carbide layer 21 is implanted by a JFET (junction field effect transistor) implant process. The oxide hard mask can be used to conduct the implant process. After removing the oxide hard mask, the junction field effect transistor layer 212 is formed on top surface of the silicon carbide layer 21.

Figure 2C:
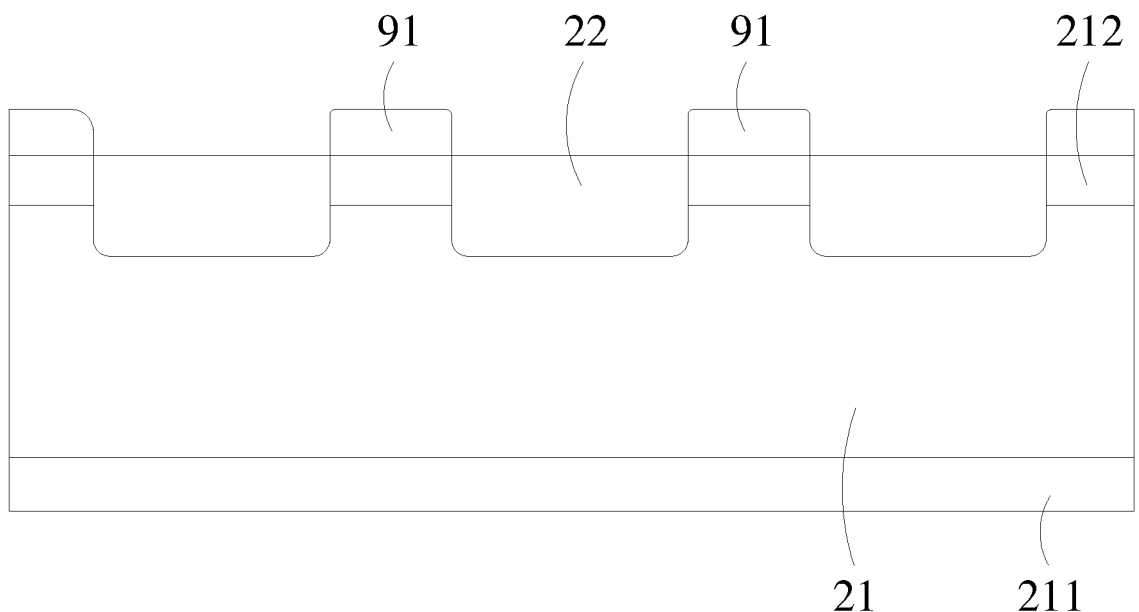

In FIG. 2C, the fabrication process provides a P-well mask 91 on the junction field effect transistor layer 212 and implants the semiconductor substrate S through the P-well mask 91 to form a P-well region 22. The P-well mask layer can be disposed on the junction field effect transistor layer 212. Etching the P-well mask layer through the photoresist to form the P-well mask 91. The P-well mask 91 is used to define the area of the implant region. The fabrication process implants the semiconductor substrate S to form the P-well region 22. That is, the junction field effect transistor layer 212 and the silicon carbide layer 21 defined by the P-well mask 91 are implanted by the dopants to form the P-well region 22.

Figure 2D:
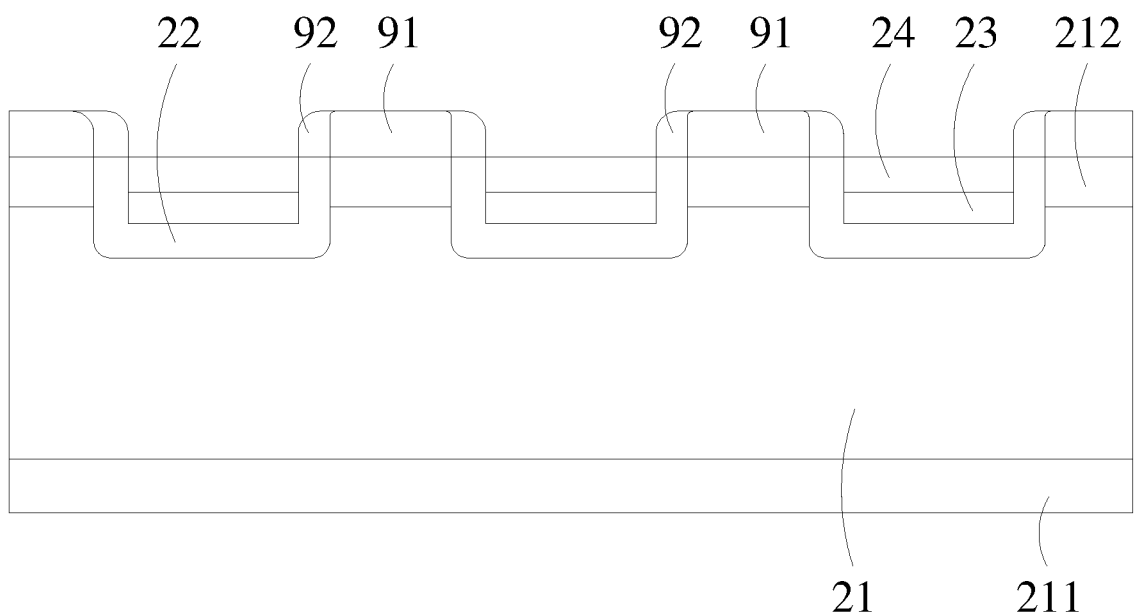

In FIG. 2D, the fabrication process disposes a spacer 92 on sidewall of the P-well mask 91 and implants the P-well region 22 through the spacer 92 to form a P-plus layer 23 and an N-plus layer 24, the N-plus layer 24 is disposed on the P-plus layer 23. After forming the P-well region 22, the next step is forming the highly doped regions. In the present disclosure, the spacers 92 are disposed on the sidewall of the p-well mask 91. These spacers 92 may be formed by a dielectric deposition process. For example, the dielectric material used in the deposition process may be silicon dioxide, silicon nitride ($Si_3N_4$), and so on. The spacers 92 cover the surrounding surface of the P-well region 22 and the exposed surface of the P-well region 22 may define the doped region. The ions are implanted into the P-well region 22 to form the P-plus layer 23 and the N-plus layer 24.

The P-plus ions are implanted first to form the P-plus layer 23. Then the N-plus ions are implanted to form the N-plus layer 24 on the P-plus layer 23. The implant energy used for P-plus implantation is higher than the power used for N-plus implantation. Thus, the P-plus layer 23 may reach the deeper depth than the N-plus layer 24. The P-plus layer 23 and the N-plus layer 24 may be disposed within the P-well region 22. The P-plus layer 23 and the N-plus layer 24 are overlapped and made by the self-align process. There is no need to prepare the different masks for different types of implant regions. Therefore, the manufacturing cost can be reduced. In addition, since the fabrication process can be simplified without arranging new mask, the manufacturing tolerance can be improved. That is, the pitch distance between the elements can be reduced and the size of the MOSFET device can be reduced accordingly.

Figure 2E:
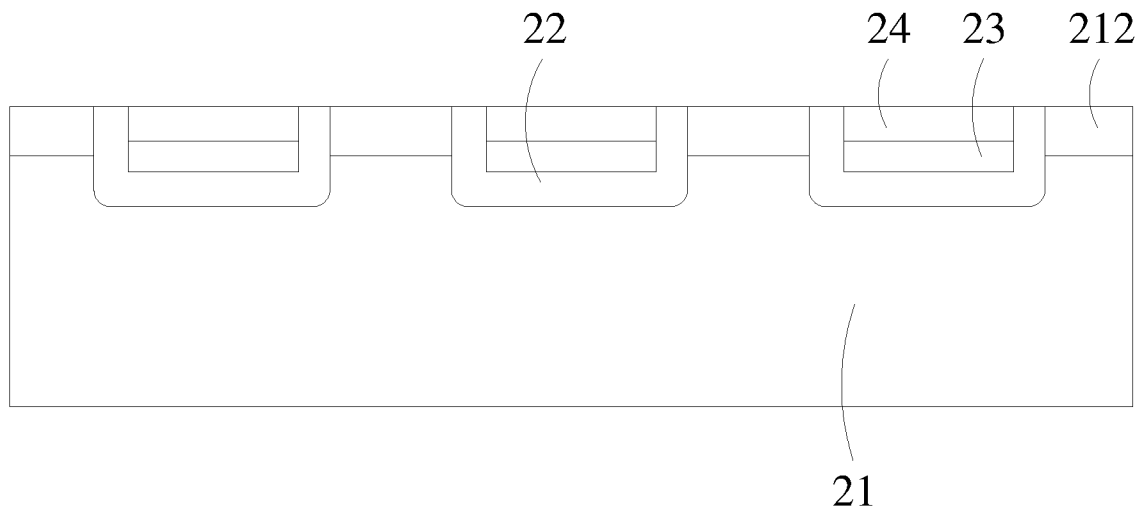

In FIG. 2E, the fabrication process removes the P-well mask 91 and the spacer 92 and conducting a backside process to remove the oxide layer 211. The hard masks including the P-well mask 91 and the spacer 92 are removed in this step. The backside process and an anneal process can be conducted to the surface of the semiconductor substrate S. The anneal process may include a high temperature anneal process over 1500° C. The backside process is conducted to remove the oxide layer 211.

Figure 2F:
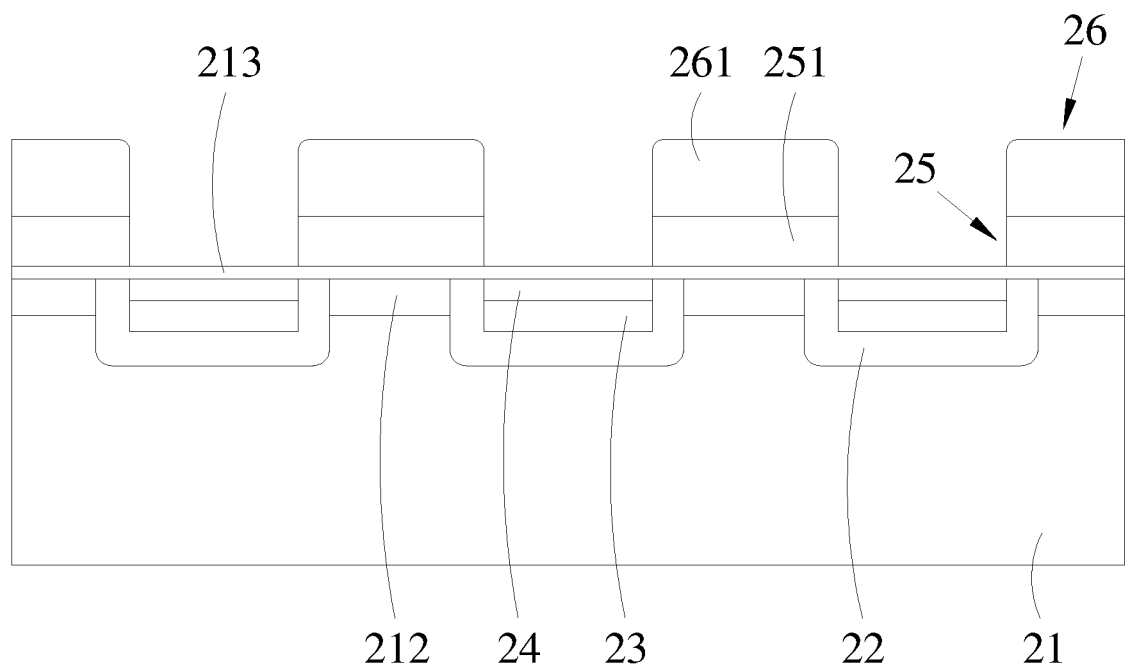

In FIG. 2F, the fabrication process disposes a gate oxide layer 213, a polysilicon layer 25 and a dielectric layer 26, the gate oxide layer 213 is disposed on the semiconductor substrate S, the polysilicon layer 25 is disposed on the gate oxide layer 213 and the dielectric layer 26 is disposed on the polysilicon layer 25. The polysilicon layer 25 and the dielectric layer 26 are etched to define a poly gate 251 and a first interlayer dielectric layer 261. When the surface of the semiconductor substrate S is cleaned, the gate oxide layer 213 is disposed on the top surface of the semiconductor substrate S and the gate oxide layer 213 covers the P-well region 22 and the highly doped regions including the P-plus layer 23 and the N-plus layer 24. The polysilicon layer 25 is disposed on the gate oxide layer 213 and the dielectric layer 26 is disposed on the polysilicon layer 25. The gate oxide layer 213 is formed by the oxidation process. The polysilicon layer 25 is formed by the polysilicon deposition and the dielectric layer 26 is formed by the dielectric material deposition. The dielectric material may include oxide dielectric material, like silicon oxide.

In order to define the gate structure, the dielectric layer 26 and the polysilicon layer 25 are etched to define the patterned position of the poly gate 251. The poly gate 251 is disposed on partial area of the highly doped regions and is isolated form the highly doped regions by the gate oxide layer 213. The remained dielectric layer 26 may be the first interlayer dielectric layer 261 covering the top surface of the poly gate 251. The etching processes for forming the poly gate 251 and a first interlayer dielectric layer 261 may use the same mask. There is no need to provide a mask for defining the gate structure and another mask for forming the contact structure. Therefore, the numbers of the mask used in the fabrication process can be further reduced.

Figure 2G:
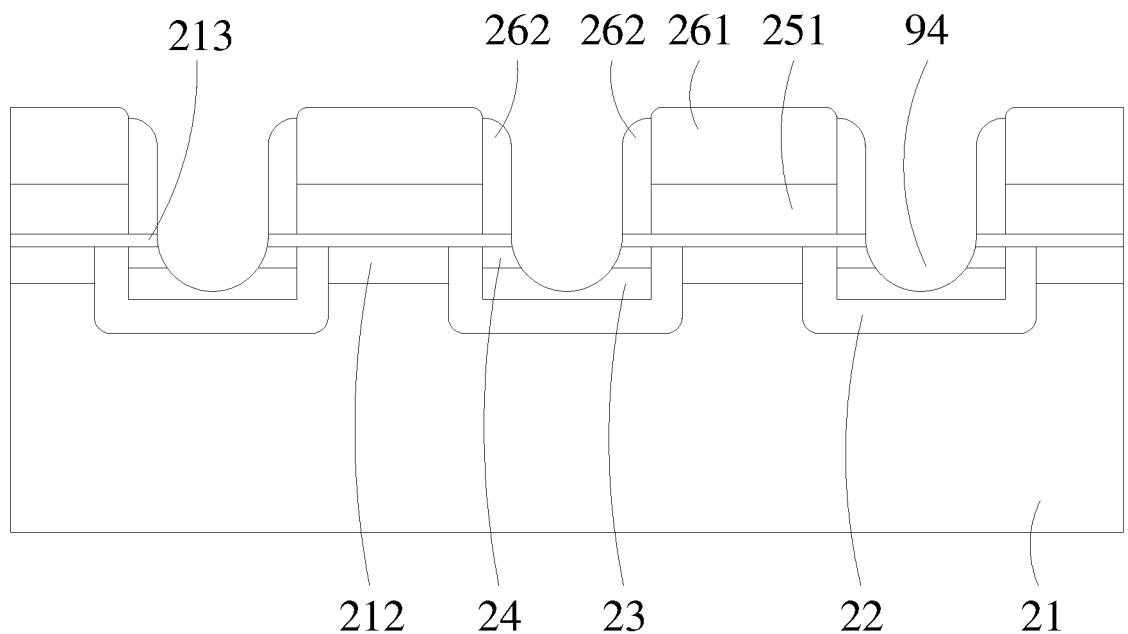

In FIG. 2G, the fabrication process disposes a second interlayer dielectric layer 262 on sidewall of the poly gate 251 and the first interlayer dielectric layer 261. The gate oxide layer 213 and the N-plus layer 24 are etched to form an opening 94 and the opening 94 exposes the P-plus layer 23. The side surfaces of the poly gate 251 and the first interlayer dielectric layer 261 are exposed. To prevent contact with the poly gate 251, the second interlayer dielectric layer 262 is formed on the sidewall of the poly gate 251 and the first interlayer dielectric layer 261. The second interlayer dielectric layer 262 can be formed by the dielectric material deposition. The poly gate 251 is covered by the first interlayer dielectric layer 261 and the second interlayer dielectric layer 262.

In the present disclosure, the first interlayer dielectric layer 261 and the second interlayer dielectric layer 262 can be made by the different dielectric materials. For example, the first interlayer dielectric layer 261 may include oxide dielectric material and the second interlayer dielectric layer 262 may include nitride dielectric material. The different materials may have different etching rate. The reason of using different materials is to make sure that the thickness of the dielectric layer after the following etching process is still enough and the breakout route won't be occurred between the gate structure and the contact structure. However, the present disclosure is not restricted by the above material. In the other embodiment, the first interlayer dielectric layer 261 and the second interlayer dielectric layer 262 may use the same dielectric material, like silicon dioxide, silicon nitride or other dielectric material. The thickness of the dielectric layer can be achieved by controlling the etching time.

The contact structure must contact both the P-plus region and the N-plus region. However, the P-plus layer 23 and the N-plus layer 24 are covered by the gate oxide layer 213. In order to form the contact structure and to contact the both region, the etching process is conducted to the gate oxide layer 213 and the N-plus layer 24 to form the opening 94. The etching process may use the second interlayer dielectric layer 262 as the hard mask. The opening 94 reaches the depth of the N-plus layer 24 and exposes the P-plus layer 23. The opening 94 can be formed by a dimple dry etch process to the semiconductor substrate S. The dimple structure means the etched semiconductor area in contact area. In the present disclosure, the shape of the dimple structure is rounded. A Ni stripe can be formed on the dimple structure by a Ni deposition process. The dimple structure exposes the regions of the P-plus layer 23 and the N-plus layer 24.

Figure 2H:
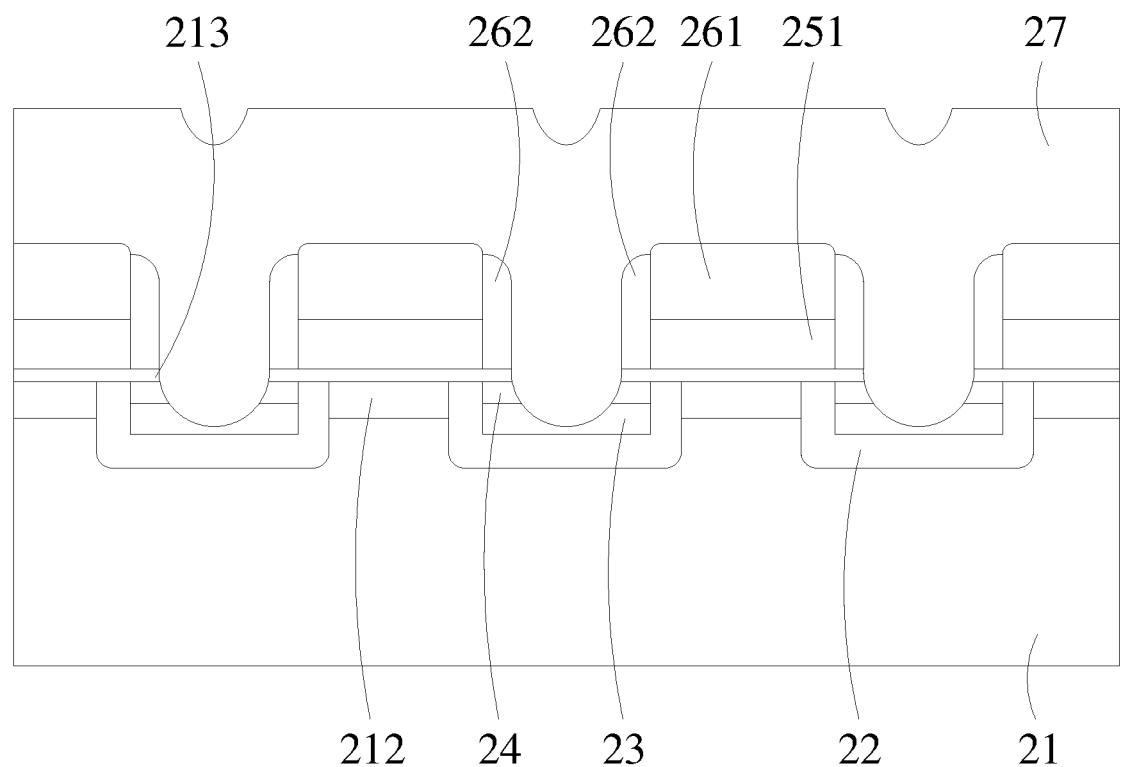

In FIG. 2H, the fabrication process disposes a metal layer 27, and the metal layer 27 covers the opening 94, the first interlayer dielectric layer 261 and the second interlayer dielectric layer 262. After forming the opening 94, the conductive material is filled in the opening 94 and covered the dielectric layer to form the metal layer 27. The metal layer 27 contacts both the N-plus layer 24 and the P-plus layer 23. The poly gate 251 is covered by the first interlayer dielectric layer 261 and the second interlayer dielectric layer 262. Thus, the poly gate 251 is isolated from the metal layer 27. A passivation deposition process may be conducted after disposing the metal layer 27.

FIG. 2H shows the schematic diagrams of the silicon carbide MOSFET in accordance with the second embodiment of the present disclosure. As shown in FIG. 2H, the silicon carbide MOSFET includes the silicon carbide layer 21, the P-well region 22, the P-plus layer 23, the N-plus layer 24, the gate oxide layer 213, the poly gate 251, the first interlayer dielectric layer 261, the second interlayer dielectric layer 262 and the metal layer 27. The P-well region 22 is disposed in the silicon carbide layer 21. The N-plus layer 24 is disposed on the P-plus layer 23. The P-plus layer 23 and the N-plus layer 24 are disposed within the P-well region 22. The gate oxide layer 213 is disposed on the silicon carbide layer 21 and the doped regions. The poly gate 251 is disposed on the gate oxide layer 213. The poly gate 251 is overlapped on partial area of the P-well region 22 and the N-plus layer 24.

The first interlayer dielectric layer 261 is disposed on the poly gate 251 and covers the top surface of the poly gate 251. The second interlayer dielectric layer 262 is disposed on side surface of the poly gate 251. The first interlayer dielectric layer 261 and the second interlayer dielectric layer 262 can be made by dielectric implant process. The materials used for forming the first interlayer dielectric layer 161 and the second interlayer dielectric layer 162 can be same or different. The dimple structure is formed between the two second interlayer dielectric layers 262 and the opening 94 exposes the P-plus layer 23. The metal layer 27 is disposed in the opening and the metal contact is able to reach both the P-plus layer 23 and the N-plus layer 24. The metal layer 27 is also disposed on the first interlayer dielectric layer 261 and the second interlayer dielectric layer 262. The metal layer 27 and the poly gate 251 are isolated by the first interlayer dielectric layer 261 and the second interlayer dielectric layer 262.

In the fabrication process of forming the silicon carbide MOSFET, the total number of mask layers may be reduced. That is, the mask for forming the highly doped region and the mask for forming the opening between the dielectric layers. The fabrication process does not need a new mask to form the proposed device. The manufacturing cost can be saved. In addition, the minimum pitch size can be reduced based on the saving of the mask layers. Therefore, the electrical properties of the semiconductor device can be improved.

Please refer to FIG. 3A to FIG. 3H, which are the schematic diagrams of the fabrication process of forming the silicon carbide MOSFET in accordance with the third embodiment of the present disclosure. FIG. 3A to FIG. 3H show the section view of the MOSFET device.

Figure 3A:
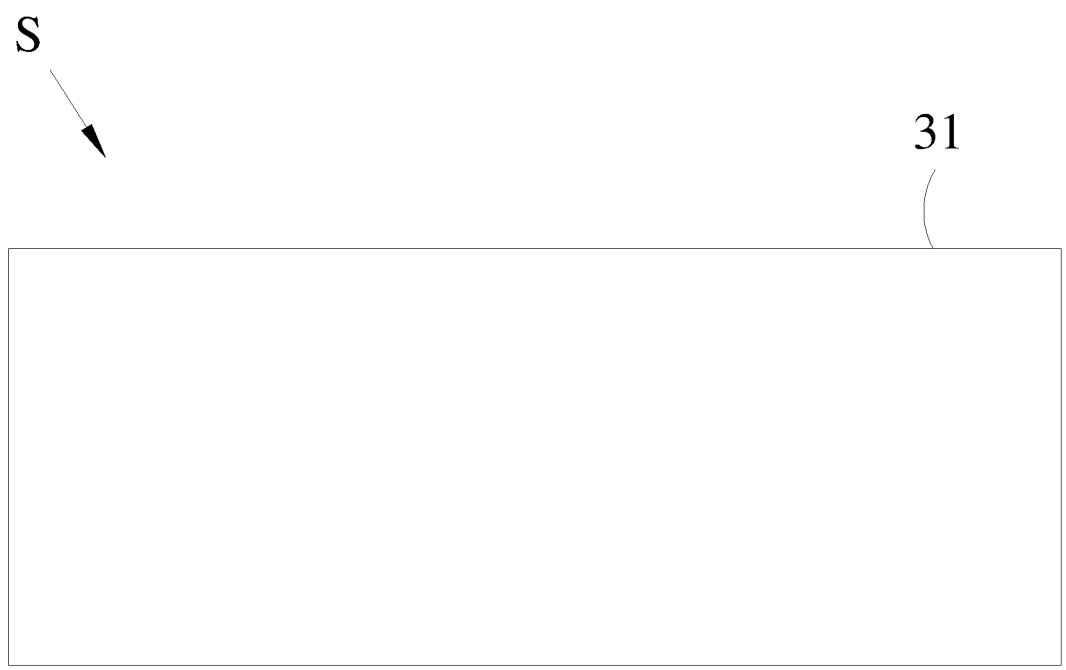
FIG. 3A to FIG. 3H are schematic diagrams of the fabrication process of forming the silicon carbide MOSFET in accordance with the third embodiment of the present disclosure.

In FIG. 3A, the fabrication process provides a semiconductor substrate S, the semiconductor substrate S has a silicon carbide layer 31. Firstly, a silicon wafer is provided. A photoresist can be used to define the alignment mark. The silicon carbide layer 31 is formed by a dry etching process and the photo resistor will be removed. The silicon carbide layer 31 may be an n-drift region. In the other embodiment, the silicon carbide layer 31 may be disposed on the oxide layer.

Figure 3B:
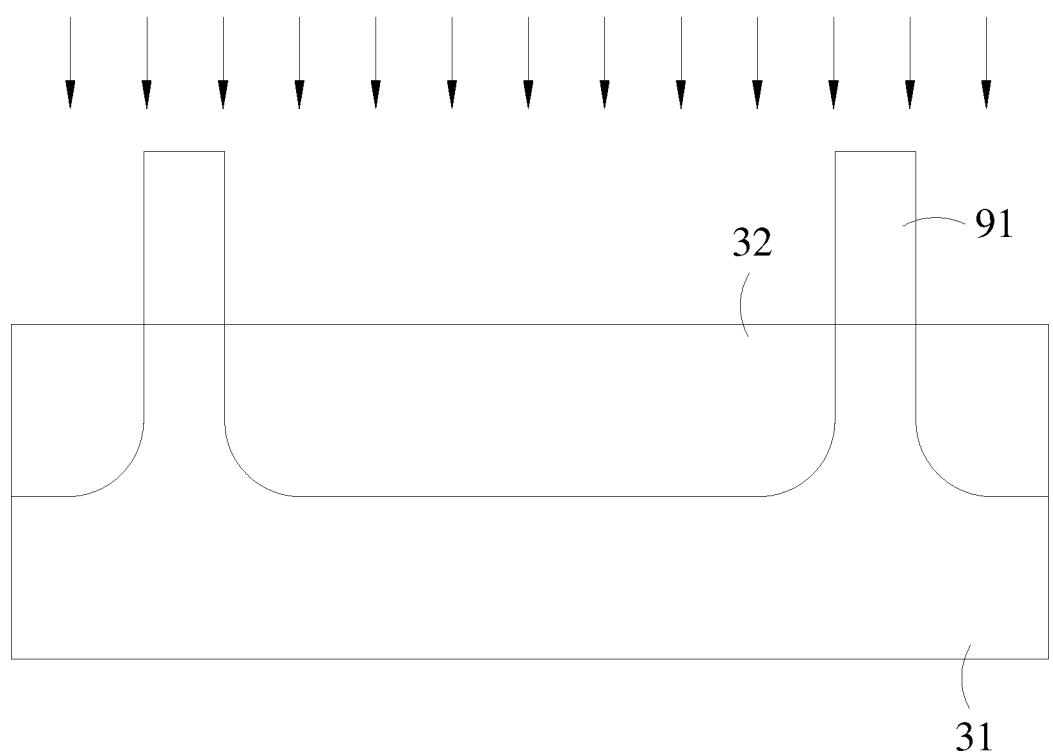

In FIG. 3B, the fabrication process provides a P-well mask 91 on the semiconductor substrate and implants the semiconductor substrate S through the P-well mask 91 to form a P-well region 32. In order to provide the P-well mask 91, a P-well mask layer can be disposed on the silicon carbide layer 31. Etching the P-well mask layer through the photoresist to form the P-well mask 91. The P-well mask 91 is used to define the area of the implant region. The fabrication process implants the semiconductor substrate S to form the P-well region 32. That is, the area of the silicon carbide layer 31 defined by the P-well mask 91 is implanted by the dopants to form the P-well region 32.

Figure 3C:
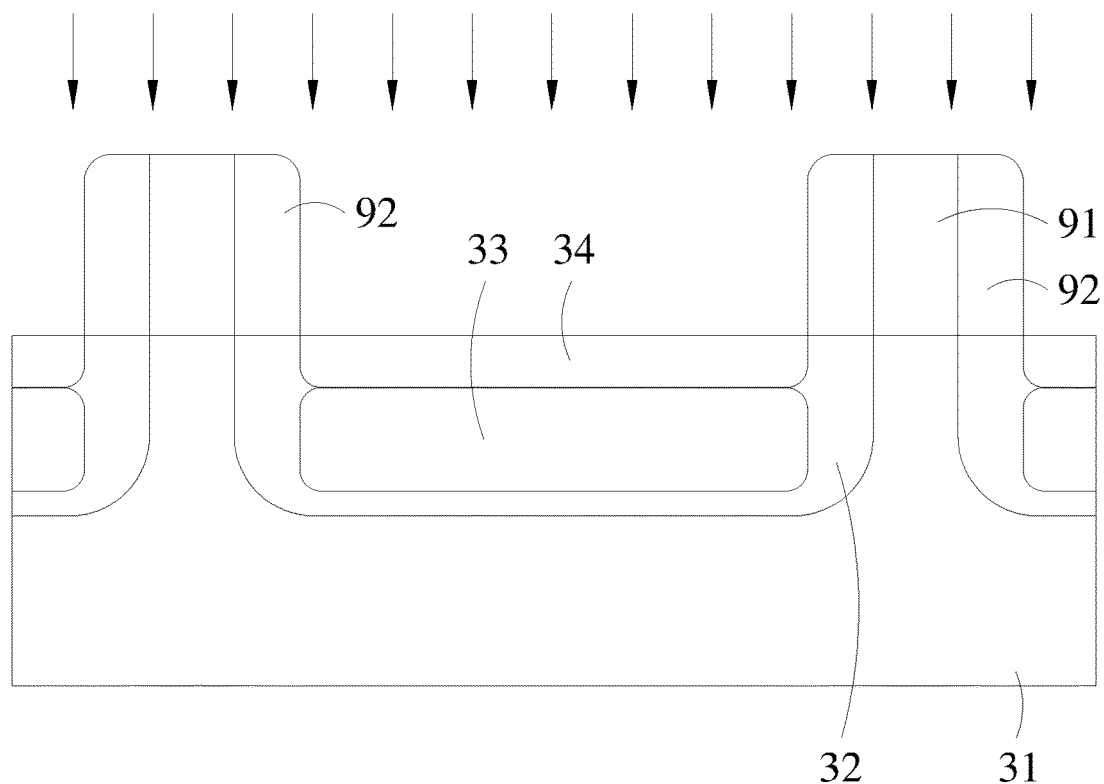

In FIG. 3C, the fabrication process disposes a spacer 92 on sidewall of the P-well mask 91 and implants the P-well region 32 through the spacer 92 to form a P-plus layer 33 and an N-plus layer 34, the N-plus layer 34 is disposed on the P-plus layer 33. After forming the P-well region 32, the next step is forming the highly doped regions. In the present disclosure, the spacers 92 are disposed on the sidewall of the p-well mask 91. These spacers 92 may be formed by a dielectric deposition process. For example, the dielectric material used in the deposition process may be silicon dioxide, silicon nitride ($Si_3N_4$), and so on. The spacers 92 cover the surrounding surface of the P-well region 32 and the exposed surface of the P-well region 32 may define the doped region. The ions are implanted into the P-well region 32 to form the P-plus layer 33 and the N-plus layer 34. The P-plus layer 33 and the N-plus layer 34 may be disposed within the P-well region 32.

The P-plus ions are implanted first to form the P-plus layer 33. Then the N-plus ions are implanted to form the N-plus layer 34 on the P-plus layer 33. The implant energy used for P-plus implantation is higher than the power used for N-plus implantation. Thus, the P-plus layer 33 may reach the deeper depth than the N-plus layer 34. The P-well mask 91 and the spacer 92 can be used as the same mask for forming both the P-plus layer 33 and the N-plus layer 34. The P-plus layer 33 and the N-plus layer 34 are overlapped and made by the self-align process. There is no need to prepare the different masks for different types of implant regions. Therefore, the manufacturing cost can be reduced. In addition, since the fabrication process can be simplified without arranging new mask, the manufacturing tolerance can be improved. That is, the pitch distance between the elements can be reduced and the size of the MOSFET device can be reduced accordingly.

Figure 3D:
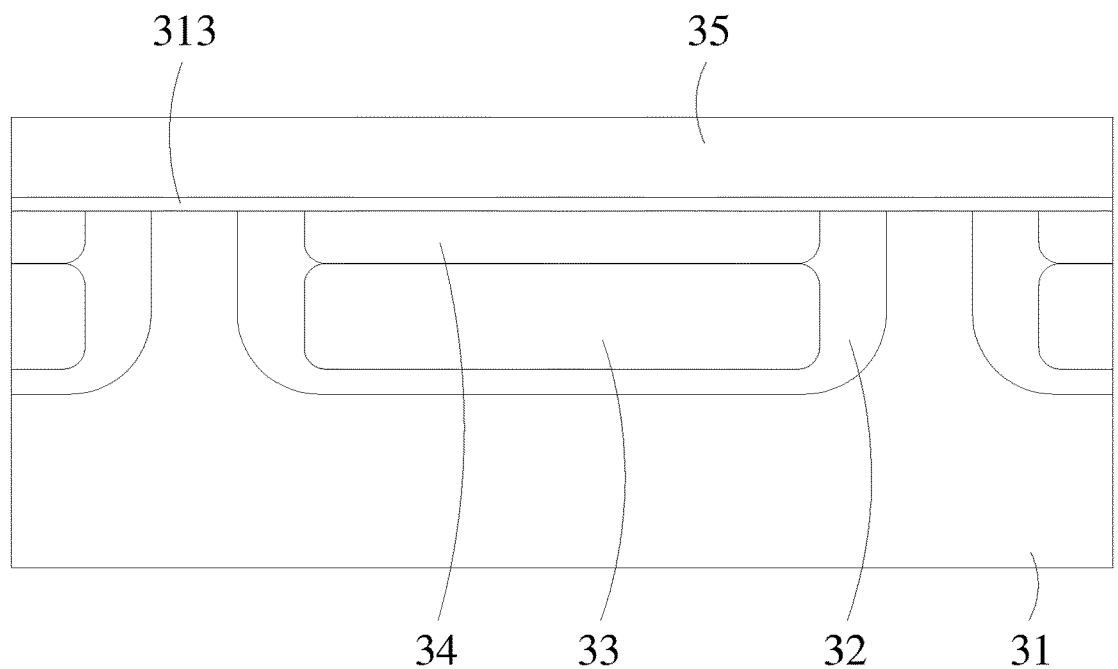

In FIG. 3D, the fabrication process removes the P-well mask 91 and the spacer 92 and disposing a gate oxide layer 313 on the semiconductor substrate S by an oxidation process. The fabrication process disposes a polysilicon layer 35 on the semiconductor substrate S. The polysilicon layer 35 is disposed on the gate oxide layer 313. After forming the P-plus layer 33 and the N-plus layer 34, the hard masks including the P-well mask 91 and the spacer 92 are removed. An oxidation process and an anneal process can be conducted to the surface of the semiconductor substrate S. The anneal process may include a high temperature anneal process over 1500° C., for example at 1700° C. If the silicon carbide layer is disposed on the oxide layer, a backside process may be conducted to remove the oxide layer. When the surface of the semiconductor substrate S is cleaned, the gate oxide layer 313 is thermally grown on the surface of the semiconductor substrate S and treated to reduce interface trap densities on interface between the gate oxide layer 313 and the surface of the semiconductor substrate S. After that, the polysilicon layer 35 is disposed on the gate oxide layer 313. The polysilicon layer 35 is formed by the poly deposition process.

Figure 3E:
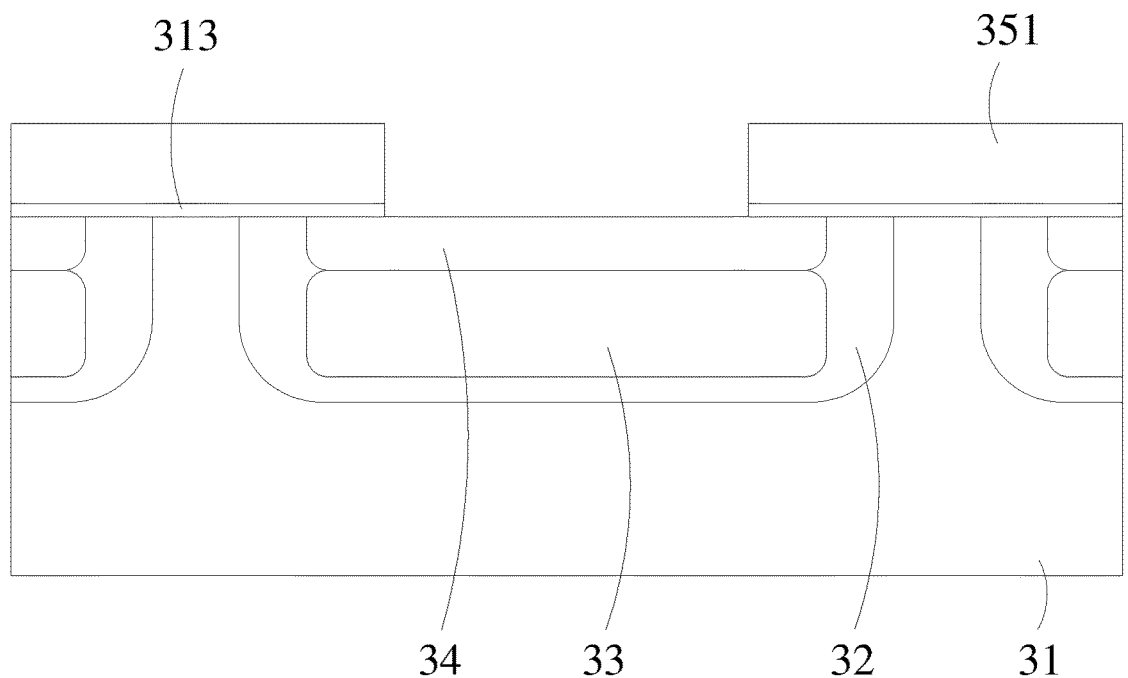

In FIG. 3E, the fabrication process etches the polysilicon layer 35 through the gate mask to define a poly gate 351. The polysilicon layer 35 is etched to define the patterned position of the poly gate 351. The poly gate 351 is disposed on partial area of the highly doped regions and is isolated form the highly doped regions by the gate oxide layer 313. The hard mask used in the etching process is removed after forming the poly gate 351.

Figure 3F:
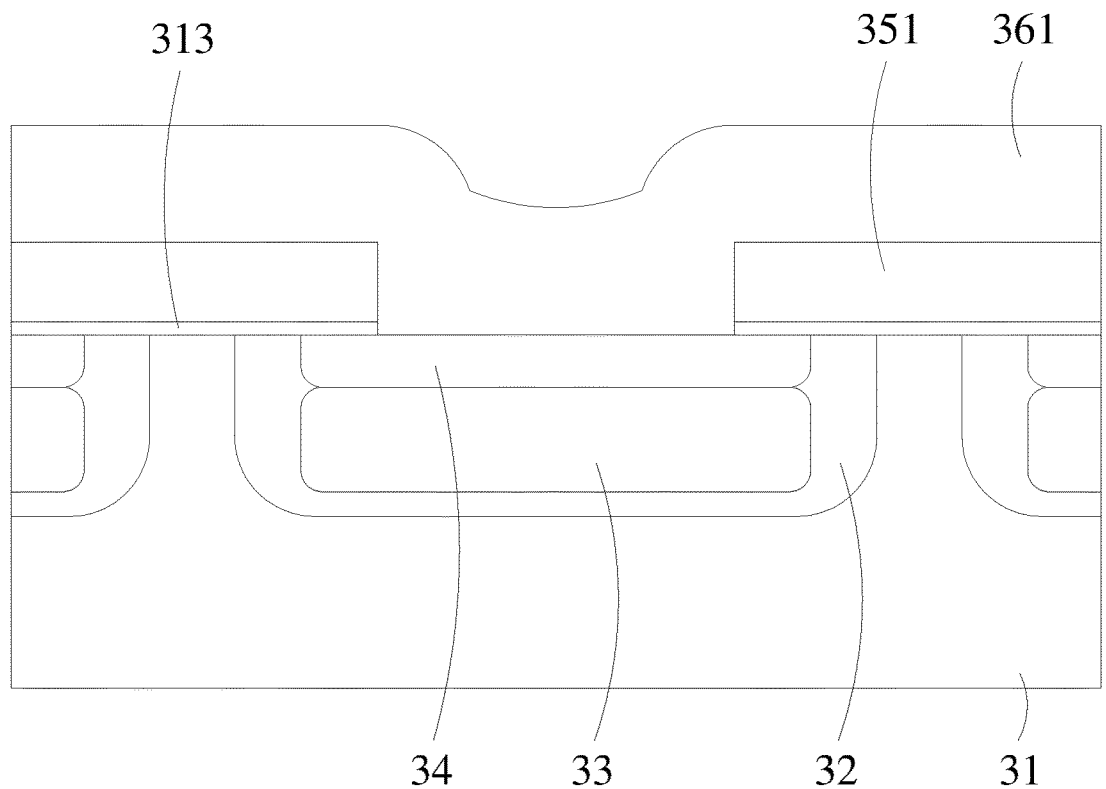

In FIG. 3F, the fabrication process disposes a first interlayer dielectric layer 361 on the poly gate 351 and the substrate S, and the first interlayer dielectric layer 361 covers the poly gate 351. Since the poly gate 351 is formed, the interlayer dielectric layer 361 is disposed on the poly gate 351 to cover the poly gate 351. The first interlayer dielectric layer 361 also fills the space between the two poly gates 351. The first interlayer dielectric layer 361 includes the dielectric material. For example, silicon dioxide, silicon nitride and so on. The top surface and the side surface of the poly gate 351 are covered by the first interlayer dielectric layer 361. The first interlayer dielectric layer 361 may have a preset thickness to ensure protection of the dielectric structure.

Figure 3G:
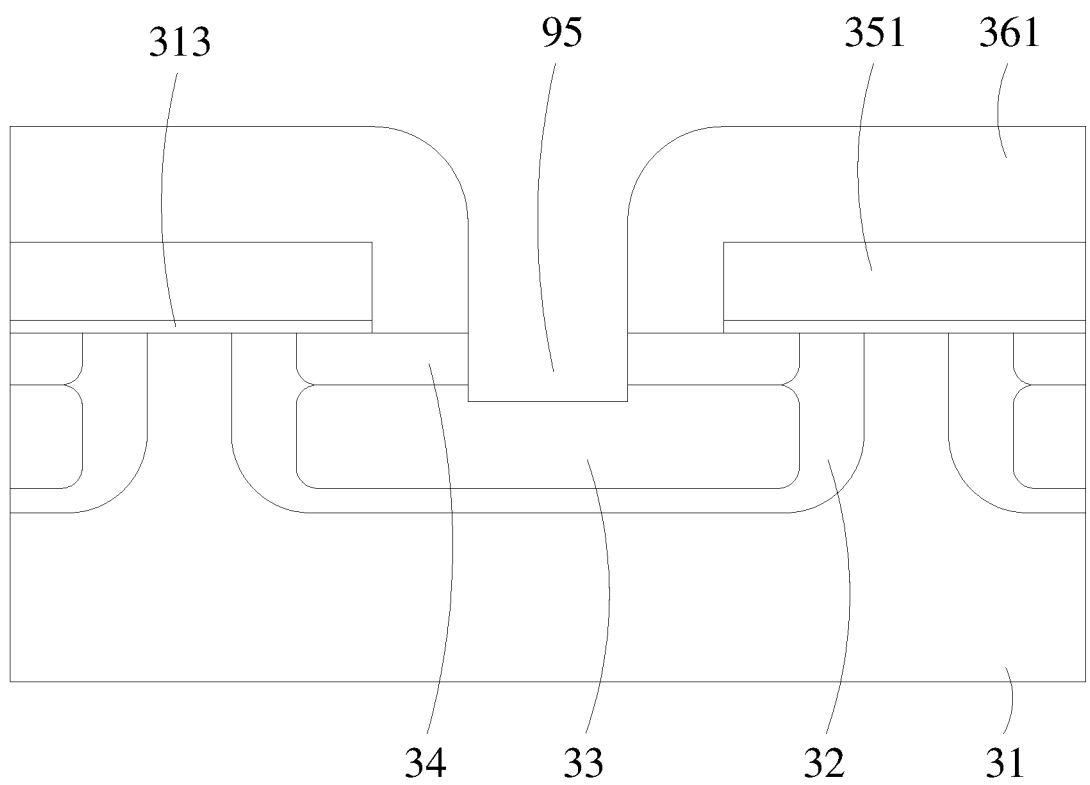

In FIG. 3G, the fabrication process etches the first interlayer dielectric layer 361 to form an opening 95, the opening 95 exposes the P-plus layer 33. To make the MOSFET device work functionally, the contact structure must contact both the P-plus region and the N-plus region. However, the P-plus layer 33 is covered by the N-plus layer 34 and the N-plus layer 34 is covered by the first interlayer dielectric layer 361. In order to form the contact structure and to contact the both doped regions, the etching process is conducted to the first interlayer dielectric layer 361 and the N-plus layer 34 to form the opening 95. The opening 95 reaches over the depth of the N-plus layer 34 and exposes the P-plus layer 33.

As shown in FIG. 3G, the opening 95 can be formed by a dimple dry etch process to the semiconductor substrate S. The dimple structure means the etched semiconductor area in contact area. In the present disclosure, the shape of the dimple structure is rectangular. However, the present disclosure is not limited on the present embodiment. In the other embodiment, the shape of the dimple structure may be trapezoid or rounded, which can be varied according to sidewall shape of etched area. The dimple structure exposes the region of the P-plus layer 33.

Figure 3H:
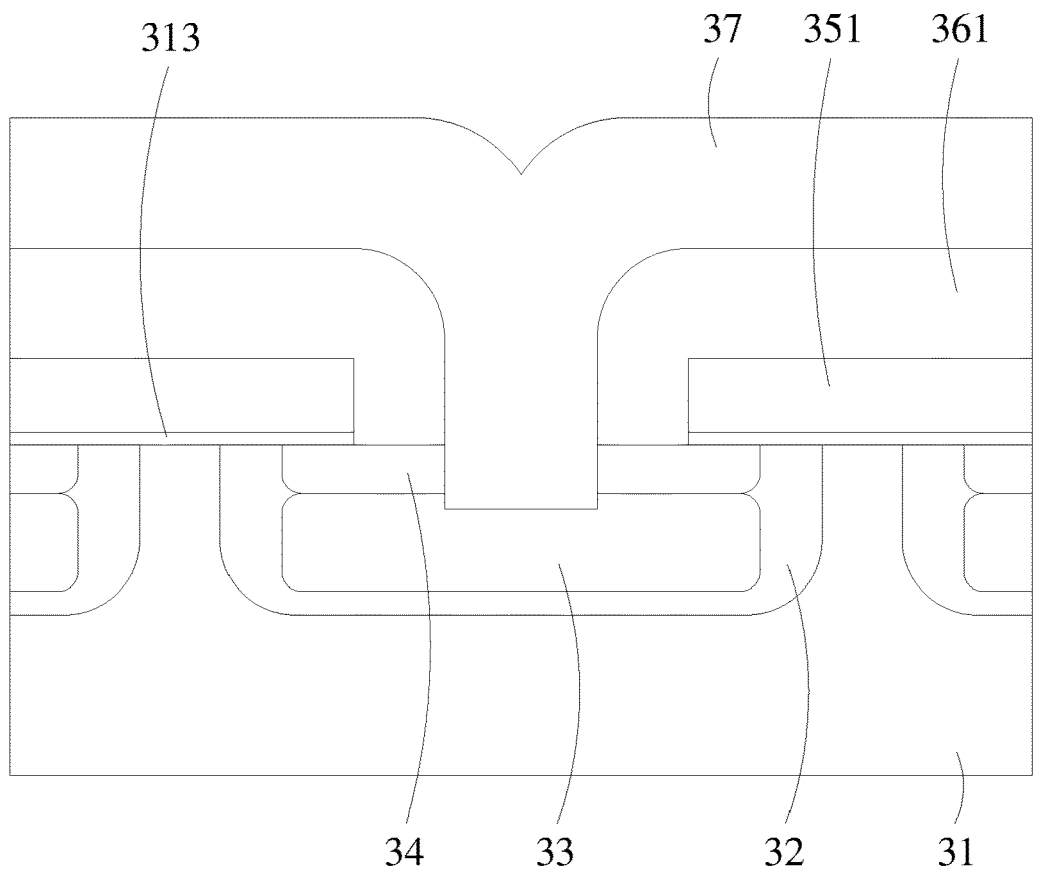

In FIG. 3H, the fabrication process disposes a metal layer 37 to cover the opening 95 and the first interlayer dielectric layer 361. After forming the opening 95, the conductive material is filled in the opening 95 and covered the first interlayer dielectric layer 361 to form the metal layer 37. The metal layer 37 contacts both the N-plus layer 34 and the P-plus layer 33. The poly gate 351 is covered by the first interlayer dielectric layer 361. As mentioned above, the first interlayer dielectric layer 361 includes the preset thickness.

Even if the first interlayer dielectric layer 361 is etched in the process of forming the opening 95, the thickness of the first interlayer dielectric layer 361 is still enough to separate the metal layer 37. A passivation deposition process may be conducted after disposing the metal layer 37.

FIG. 3H shows the schematic diagrams of the silicon carbide MOSFET in accordance with the third embodiment of the present disclosure. As shown in FIG. 3H, the silicon carbide MOSFET includes the silicon carbide layer 31, the P-well region 32, the P-plus layer 33, the N-plus layer 34, the gate oxide layer 313, the poly gate 351, the first interlayer dielectric layer 361 and the metal layer 37. The P-well region 32 is disposed in the silicon carbide layer 31. The N-plus layer 34 is disposed on the P-plus layer 33. The P-plus layer 33 and the N-plus layer 34 are disposed within the P-well region 32. The poly gate 351 is disposed on the gate oxide layer 313 and the doped regions. That is, the poly gate 351 is overlapped on partial area of the P-well region 32 and the N-plus layer 34.

The first interlayer dielectric layer 361 is disposed on the poly gate 351 and covers the top surface and side surface of the poly gate 351. The opening is formed between the two first interlayer dielectric layers 361 and the opening exposes the P-plus layer 33. The metal layer 37 is disposed in the opening and the metal contact is able to reach both the P-plus layer 33 and the N-plus layer 34. The metal layer 37 is also disposed on the first interlayer dielectric layer 361. The metal layer 37 and the poly gate 351 are isolated by the first interlayer dielectric layer 361.

Please refer to FIG. 4A to FIG. 4H, which are the schematic diagrams of the fabrication process of forming the silicon carbide MOSFET in accordance with the fourth embodiment of the present disclosure. FIG. 4A to FIG. 4H show the section view of the MOSFET device.

Figure 4A:
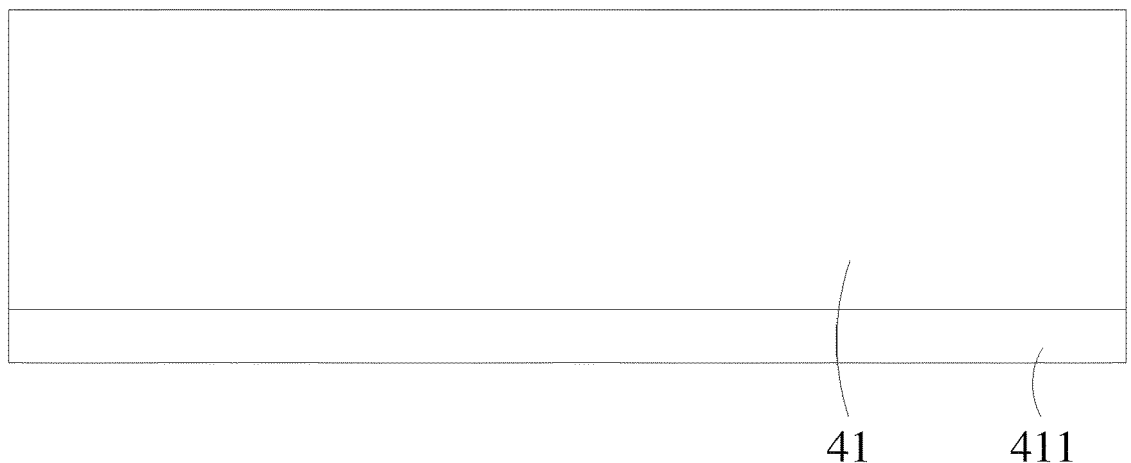
FIG. 4A to FIG. 4H are schematic diagrams of the fabrication process of forming the silicon carbide MOSFET in accordance with the fourth embodiment of the present disclosure.

In FIG. 4A, the fabrication process provides a semiconductor substrate S, the semiconductor substrate S having a silicon carbide layer 41 and the silicon carbide layer 41 is disposed on an oxide layer 411. A silicon wafer is provided. A photoresist can be used to define the alignment mark. The silicon carbide layer 41 is formed by a dry etching process and the photo resistor will be removed. The silicon carbide layer 41 may be an n-drift region.

Figure 4B:
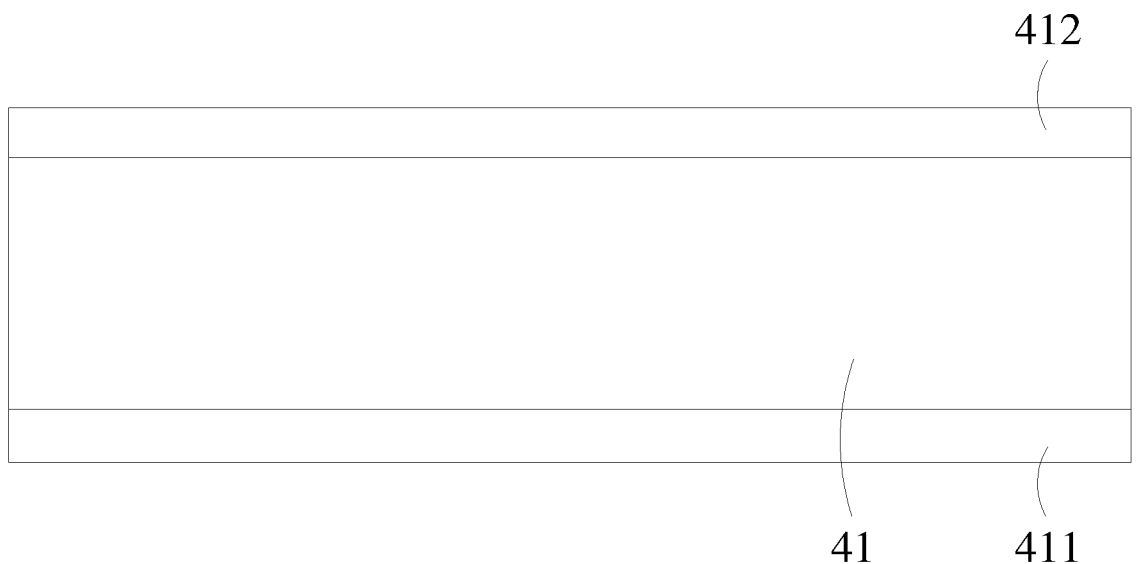

In FIG. 4B, the fabrication process forms a junction field effect transistor layer 412 on the silicon carbide layer 41. The all active are of the silicon carbide layer 41 is implanted by a JFET (junction field effect transistor) implant process. The oxide hard mask can be used to conduct the implant process. After removing the oxide hard mask, the junction field effect transistor layer 412 is formed on top surface of the silicon carbide layer 41.

Figure 4C:
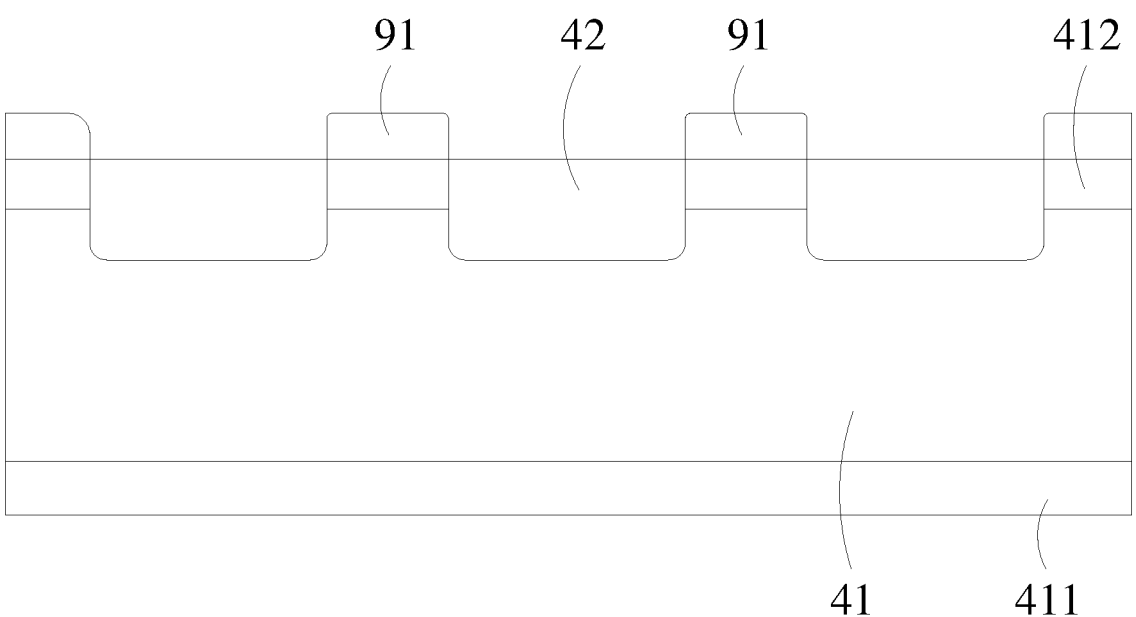

In FIG. 4C, the fabrication process provides a P-well mask 91 on the junction field effect transistor layer 412 and implants the semiconductor substrate S through the P-well mask 91 to form a P-well region 42. The P-well mask layer can be disposed on the junction field effect transistor layer 412. Etching the P-well mask layer through the photoresist to form the P-well mask 91. The P-well mask 91 is used to define the area of the implant region. The fabrication process implants the semiconductor substrate S to form the P-well region 42. That is, the junction field effect transistor layer 412 and the silicon carbide layer 41 defined by the P-well mask 91 are implanted by the dopants to form the P-well region 42.

Figure 4D:
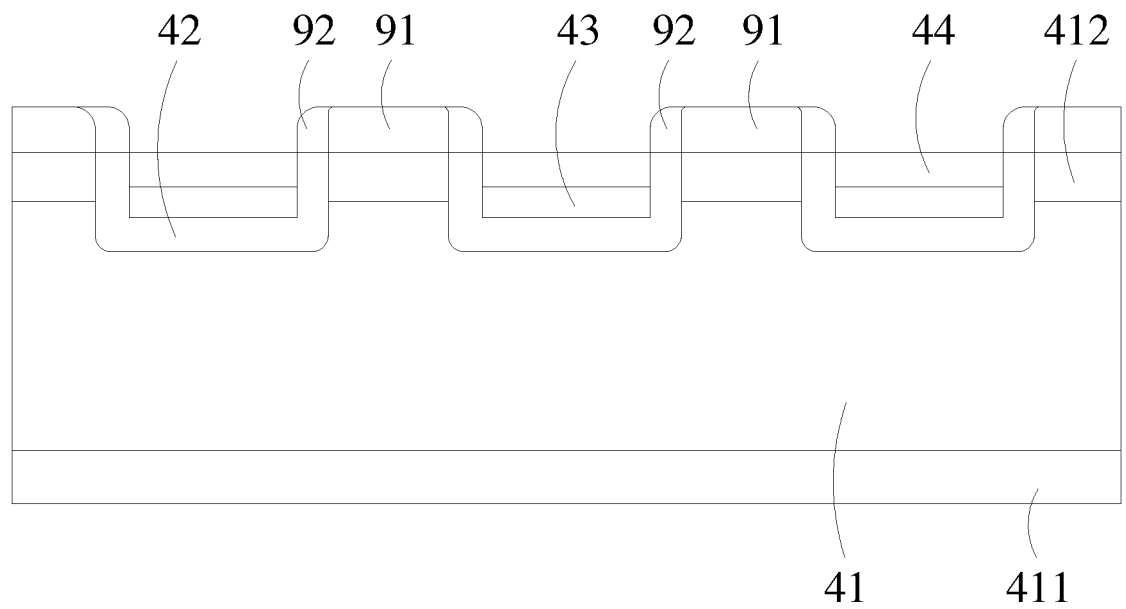

In FIG. 4D, the fabrication process disposes a spacer 92 on sidewall of the P-well mask 91 and implants the P-well region 42 through the spacer 92 to form a P-plus layer 43 and an N-plus layer 44. The N-plus layer 44 is disposed on the P-plus layer 43. After forming the P-well region 42, the next step is forming the highly doped regions. In the present disclosure, the spacers 92 are disposed on the sidewall of the p-well mask 91. These spacers 92 may be formed by a dielectric deposition process. For example, the dielectric material used in the deposition process may be silicon dioxide, silicon nitride ($Si_3N_4$), and so on. The spacers 92 cover the surrounding surface of the P-well region 42 and the exposed surface of the P-well region 42 may define the doped region. The ions are implanted into the P-well region 42 to form the P-plus layer 43 and the N-plus layer 44.

The P-plus ions are implanted first to form the P-plus layer 43. Then the N-plus ions are implanted to form the N-plus layer 44 on the P-plus layer 43. The implant energy used for P-plus implantation is higher than the power used for N-plus implantation. Thus, the P-plus layer 43 may reach the deeper depth than the N-plus layer 44. The P-plus layer 43 and the N-plus layer 44 may be disposed within the P-well region 42. The P-plus layer 43 and the N-plus layer 44 are overlapped and made by the self-align process. There is no need to prepare the different masks for different types of implant regions. Therefore, the manufacturing cost can be reduced. In addition, since the fabrication process can be simplified without arranging new mask, the manufacturing tolerance can be improved. That is, the pitch distance between the elements can be reduced and the size of the MOSFET device can be reduced accordingly.

Figure 4E:
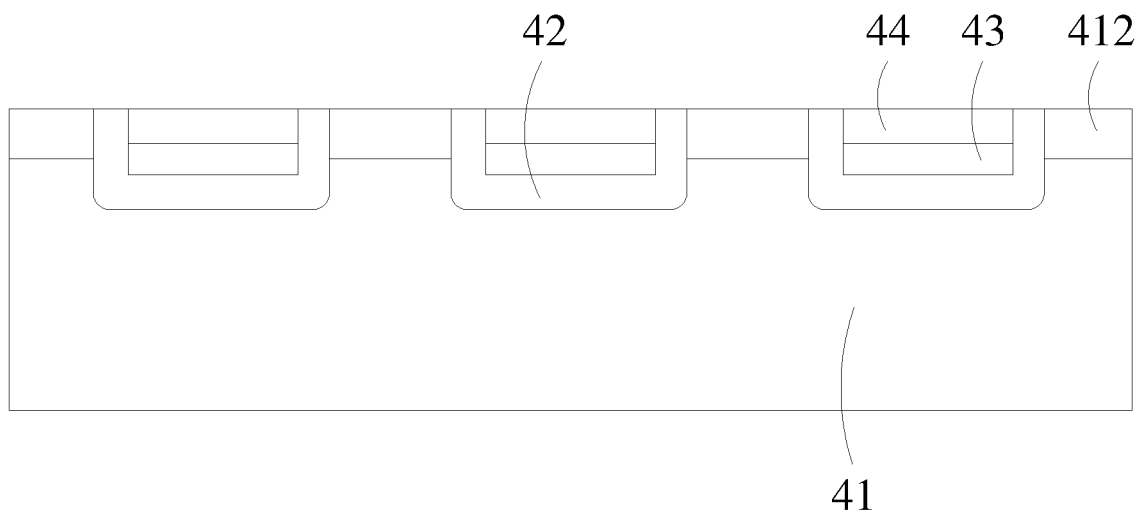

In FIG. 4E, the fabrication process removes the P-well mask 91 and the spacer 92 and conducting a backside process to remove the oxide layer 411. The hard masks including the P-well mask 91 and the spacer 92 are removed in this step. The backside process and an anneal process can be conducted to the surface of the semiconductor substrate S. The anneal process may include a high temperature anneal process over 1500° C. The backside process is conducted to remove the oxide layer 411.

Figure 4F:
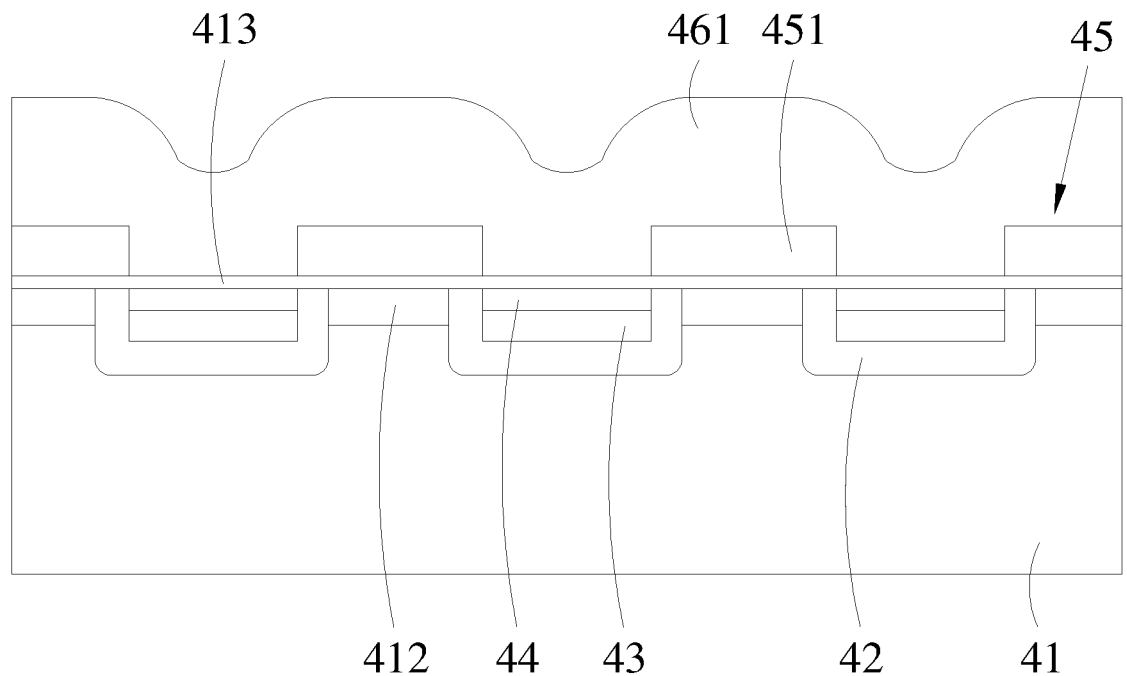

In FIG. 4F, the fabrication process disposes a gate oxide layer 413 and a polysilicon layer 45, the gate oxide layer 413 is disposed on the semiconductor substrate S, and the polysilicon layer 45 is disposed on the gate oxide layer 413. The polysilicon layer 45 is etched to define a poly gate 451 and a first interlayer dielectric layer 461 is disposed on the poly gate 451. When the surface of the semiconductor substrate S is cleaned, the gate oxide layer 413 is disposed on the top surface of the semiconductor substrate S and the gate oxide layer 413 covers the P-well region 42 and the highly doped regions including the P-plus layer 43 and the N-plus layer 44. The polysilicon layer 45 is disposed on the gate oxide layer 413. The gate oxide layer 413 is formed by the oxidation process. The polysilicon layer 45 is formed by the poly deposition process.

In order to define the gate structure, the polysilicon layer 45 is etched to define the patterned position of the poly gate 451. The poly gate 451 is disposed on partial area of the highly doped regions and is isolated form the highly doped regions by the gate oxide layer 413. The hard mask used in the etching process is removed after forming the poly gate 451. After forming the poly gate 451, the dielectric material is disposed on the poly gate 451 to form the first interlayer dielectric layer 461. The first interlayer dielectric layer 461 cover the top surface and side surface of the poly gate 451. The first interlayer dielectric layer 461 also fills the space between the two poly gates 451. The first interlayer dielectric layer 461 may include the dielectric material. For example, silicon dioxide, silicon nitride or other dielectric materials. The first interlayer dielectric layer 461 may have a preset thickness to ensure protection of the dielectric structure.

Figure 4G:
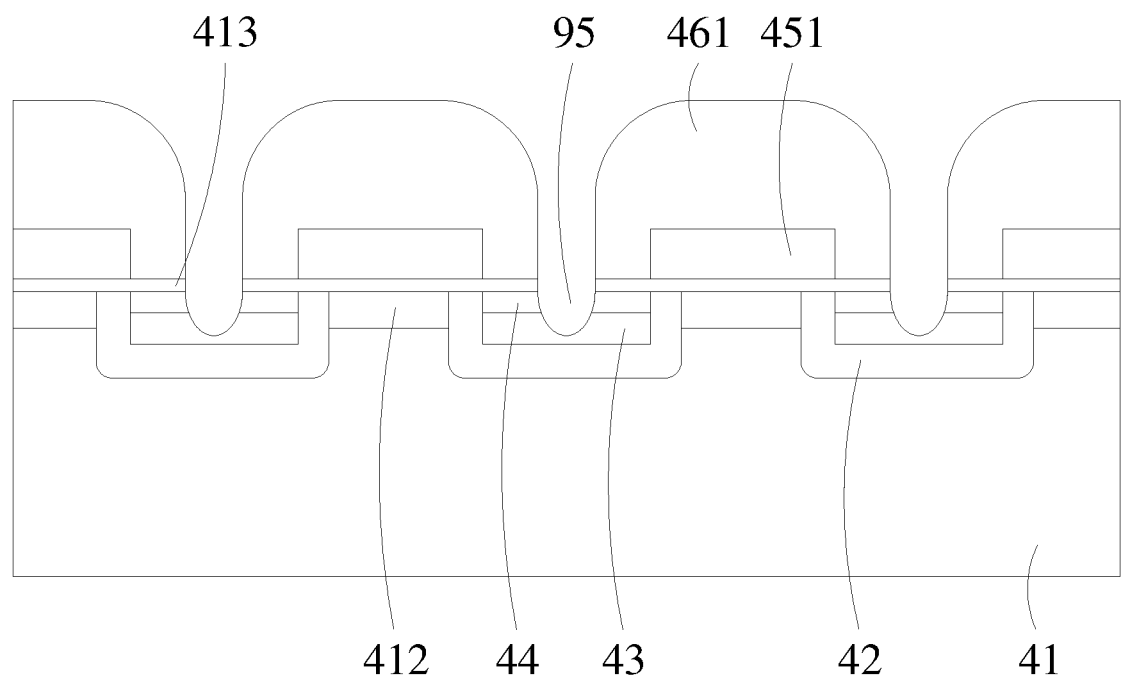

In FIG. 4G, the fabrication process etches the first interlayer dielectric layer 461 and the gate oxide layer 413 to form an opening 95 and the opening 95 exposes the P-plus layer 43. In the present disclosure, the P-plus layer 43 is covered by the N-plus layer 44 and the N-plus layer 44 is covered by the first interlayer dielectric layer 461. In order to form the contact structure and to contact the both doped region, the etching process is conducted to the first interlayer dielectric layer 461 and the N-plus layer 44 to form the opening 95. The opening 95 reaches over the depth of the N-plus layer 44 and exposes the P-plus layer 43. The opening 95 can be formed by a dimple dry etch process to the semiconductor substrate S. The dimple structure means the etched semiconductor area in contact area. In the present disclosure, the shape of the dimple structure is rounded. A Ni stripe can be formed on the dimple structure by a Ni deposition process. The dimple structure exposes the regions of the P-plus layer 43 and the N-plus layer 44.

Figure 4H:
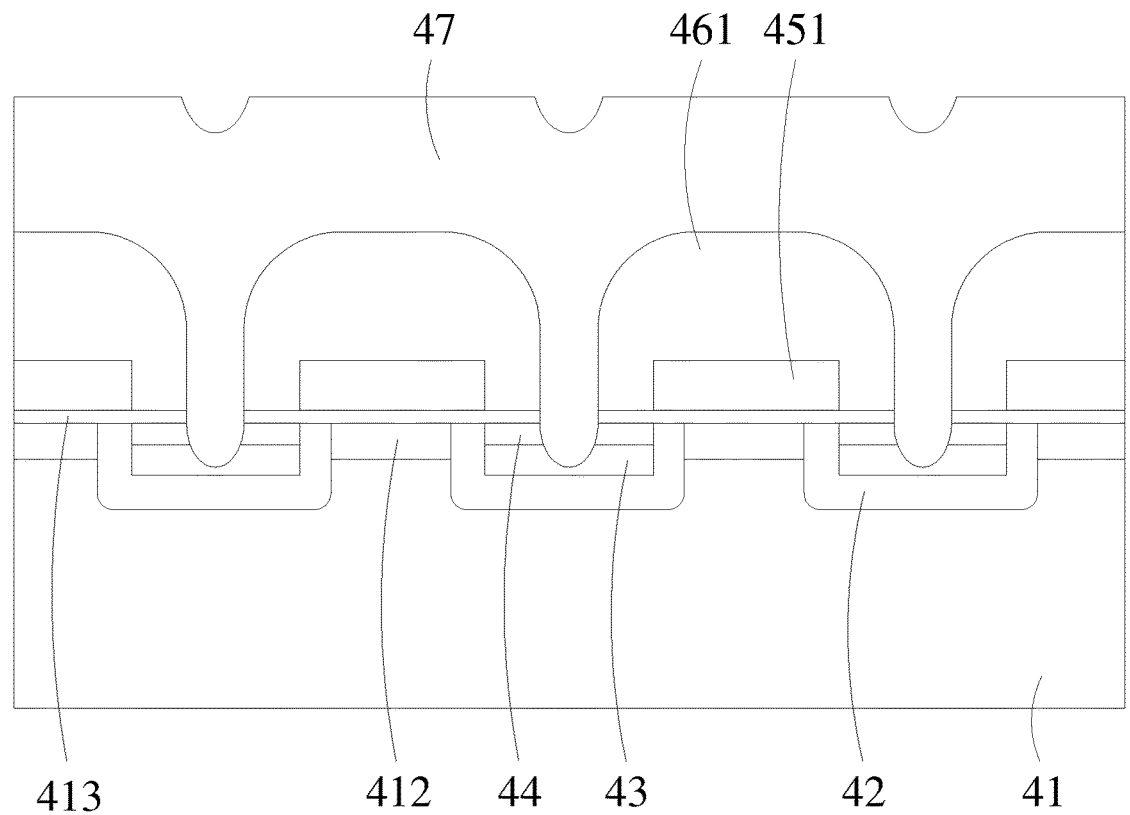

In FIG. 4H, the fabrication process disposes a metal layer 47, and the metal layer 47 covers the opening 95 and the first interlayer dielectric layer 461. After forming the opening 95, the conductive material is filled in the opening 95 and covered the dielectric layer to form the metal layer 47. The metal layer 47 contacts both the N-plus layer 44 and the P-plus layer 43. The poly gate 451 is covered by the first interlayer dielectric layer 461. Based on the thickness of the first interlayer dielectric layer 461, the poly gate 451 is isolated from the metal layer 47. A passivation deposition process may be conducted after disposing the metal layer 47.

FIG. 4H shows the schematic diagrams of the silicon carbide MOSFET in accordance with the fourth embodiment of the present disclosure. As shown in FIG. 4H, the silicon carbide MOSFET includes the silicon carbide layer 41, the P-well region 42, the P-plus layer 43, the N-plus layer 44, the gate oxide layer 413, the poly gate 451, the first interlayer dielectric layer 461 and the metal layer 47. The P-well region 42 is disposed in the silicon carbide layer 41. The N-plus layer 44 is disposed on the P-plus layer 43. The P-plus layer 43 and the N-plus layer 44 are disposed within the P-well region 42. The gate oxide layer 413 is disposed on the silicon carbide layer 41 and the doped regions. The poly gate 451 is disposed on the gate oxide layer 413. The poly gate 451 is overlapped on partial area of the P-well region 42 and the N-plus layer 44.

The first interlayer dielectric layer 461 is disposed on the poly gate 451 and covers the top surface and side surface of the poly gate 451. The dimple structure is formed between the two first interlayer dielectric layers 462 and the opening 95 exposes the P-plus layer 43. The metal layer 47 is disposed in the opening and the metal contact is able to reach both the P-plus layer 43 and the N-plus layer 44. The metal layer 47 is also disposed on the first interlayer dielectric layer 461. The metal layer 47 and the poly gate 451 are isolated by the first interlayer dielectric layer 461.

In the fabrication process of forming the silicon carbide MOSFET, the total number of mask layers may be reduced. That is, the mask for forming the highly doped region. The fabrication process does not need a new mask to form the proposed device. The manufacturing cost can be saved. In addition, the minimum pitch size can be reduced based on the saving of the mask layers. Therefore, the electrical properties of the semiconductor device can be improved.

Please refer to FIG. 5A to FIG. 5H, which are the schematic diagrams of the fabrication process of forming the silicon carbide MOSFET in accordance with the fifth embodiment of the present disclosure. FIG. 5A to FIG. 5H show the section view of the MOSFET device.

Figure 5A:
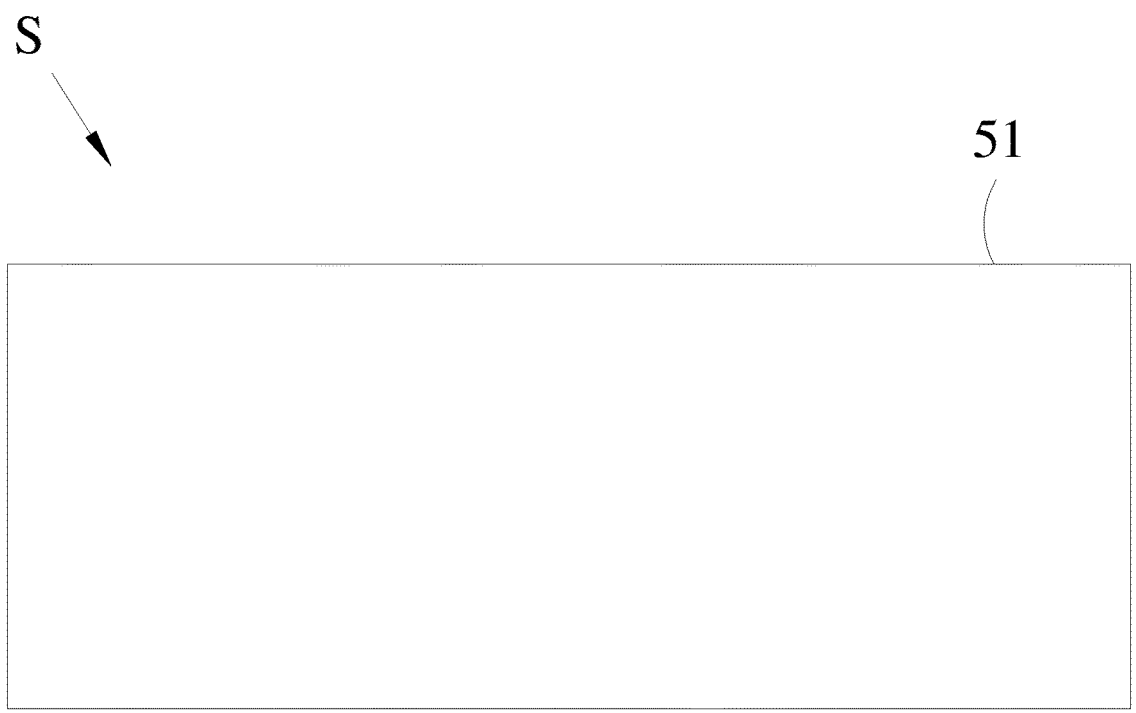
FIG. 5A to FIG. 5H are schematic diagrams of the fabrication process of forming the silicon carbide MOSFET in accordance with the fifth embodiment of the present disclosure.

In FIG. 5A, the fabrication process provides a semiconductor substrate S, the semiconductor substrate S has a silicon carbide layer 51. Firstly, a silicon wafer is provided. A photoresist can be used to define the alignment mark. The silicon carbide layer 51 is formed by a dry etching process and the photo resistor will be removed. The silicon carbide layer 51 may be an n-drift region. In the other embodiment, the silicon carbide layer 51 may be disposed on the oxide layer.

Figure 5B:
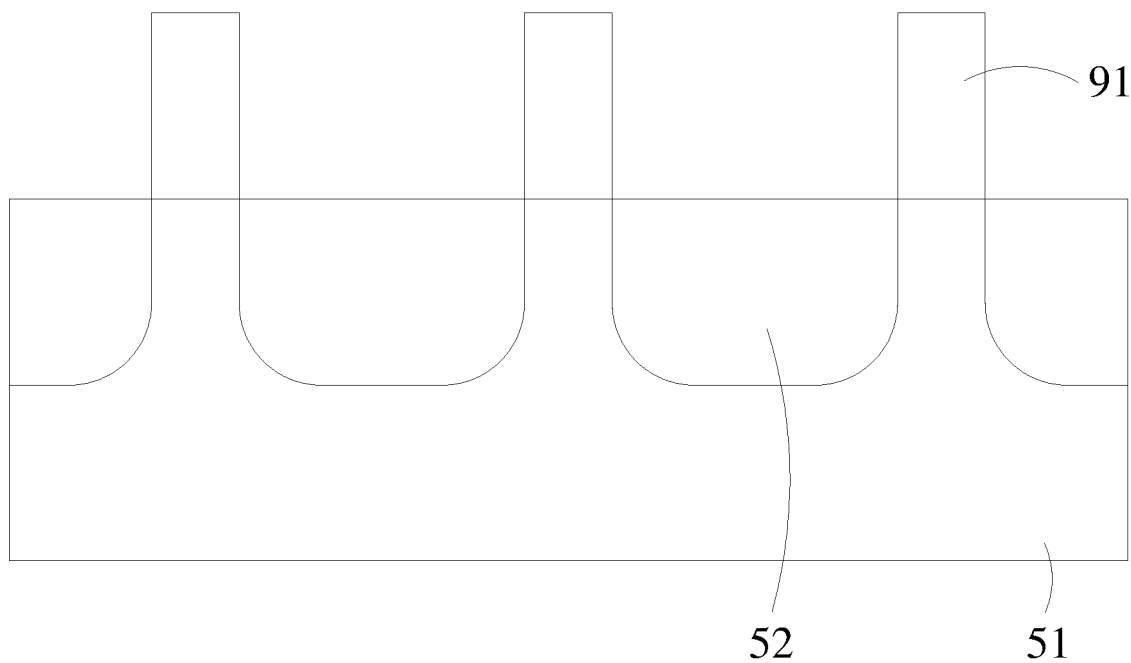

In FIG. 5B, the fabrication process provides a P-well mask 91 on the semiconductor substrate and implants the semiconductor substrate S through the P-well mask 91 to form a P-well region 52. In order to provide the P-well mask 91, a P-well mask layer can be disposed on the silicon carbide layer 51. Etching the P-well mask layer through the photoresist to form the P-well mask 91. The P-well mask 91 is used to define the area of the implant region. The fabrication process implants the semiconductor substrate S to form the P-well region 52. That is, the area of the silicon carbide layer 51 defined by the P-well mask 91 is implanted by the dopants to form the P-well region 52.

Figure 5C:
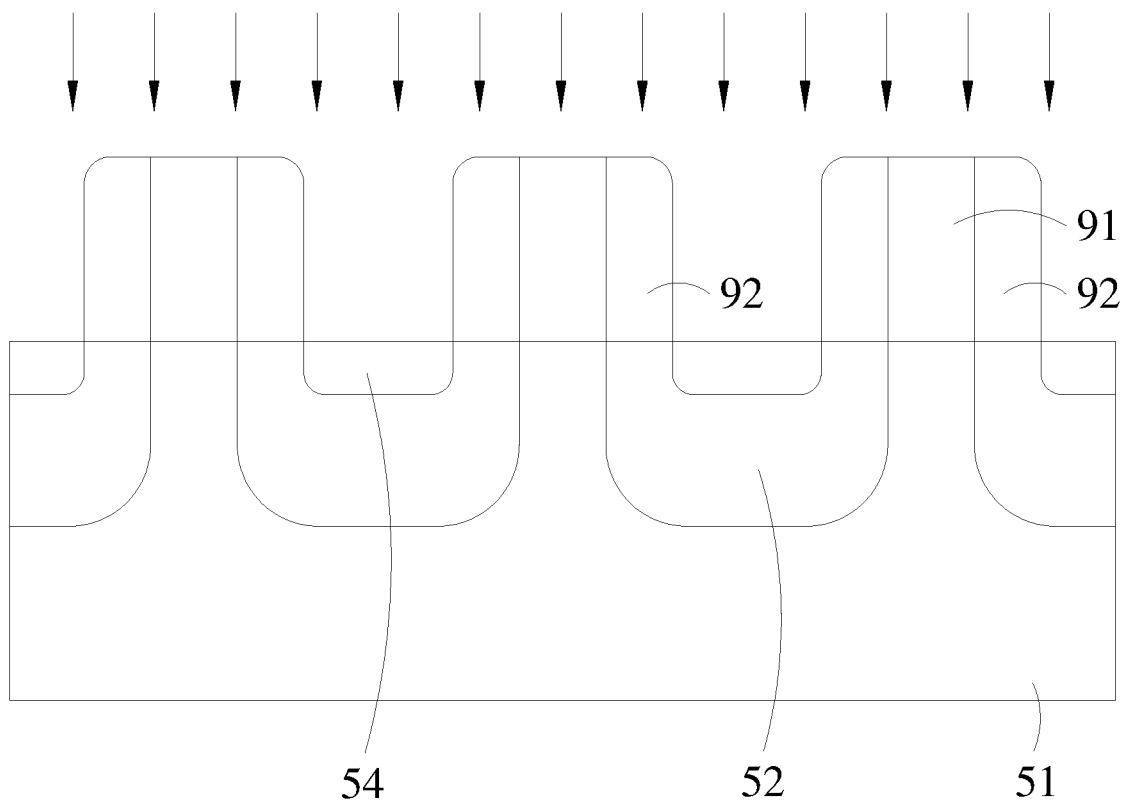

In FIG. 5C, the fabrication process disposes a spacer 92 on sidewall of the P-well mask 91 and implants the P-well region 52 through the spacer 92 to form an N-plus layer 54. After forming the P-well region 52, the next step is forming the highly doped regions. In the present disclosure, the spacers 92 are disposed on the sidewall of the p-well mask 91. These spacers 92 may be formed by a dielectric deposition process. For example, the dielectric material used in the deposition process may be silicon dioxide, silicon nitride ($Si_3N_4$), and so on. The spacers 92 cover the surrounding surface of the P-well region 52 and the exposed surface of the P-well region 52 may define the doped region. The ions are implanted into the P-well region 52 to form the N-plus layer 54. The N-plus ions are implanted to form the N-plus layer 54 and the N-plus layer 54 may be disposed within the P-well region 52.

Figure 5D:
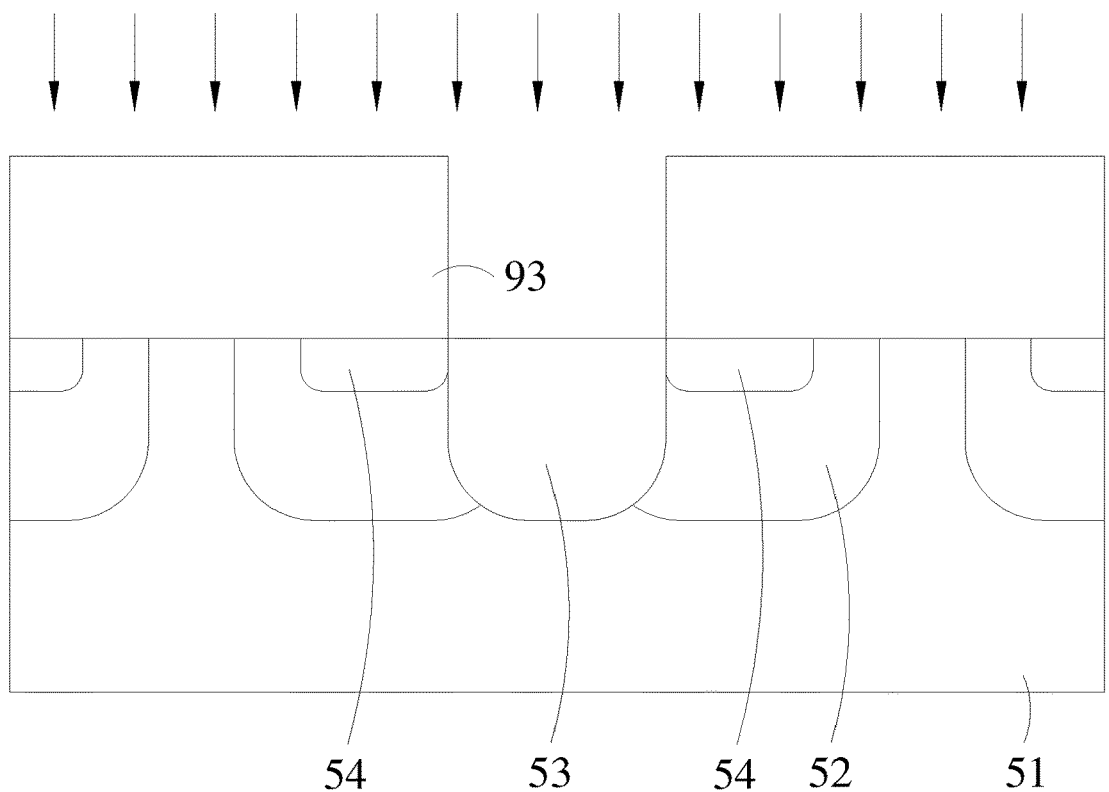

In FIG. 5D, the fabrication process removes the P-well mask 91 and the spacer 92. The fabrication process disposes a P-plus mask 93 on the semiconductor substrate S and implants semiconductor substrate S through the P-plus mask 93 to form a P-plus layer 53. The P-plus layer 53 is disposed between two N-plus layers 54. After forming the N-plus layer 54, the hard masks including the P-well mask 91 and the spacer 92 are removed. In order to define the P-plus region, the P-plus mask 93 is disposed on the semiconductor substrate S. In the present disclosure, the P-plus mask 93 can be formed on the P-well region 52 and the N-plus layer 54. The P-plus ions are implanted through the P-plus mask 93 to form the P-plus layer 53. The P-plus layer 53 is located between two N-plus layers 54. Using the P-plus mask 93 may provide a side by side structure for the two doped regions. The contact structure made in the following process may contact the both doped regions in the same plane.

Figure 5E:
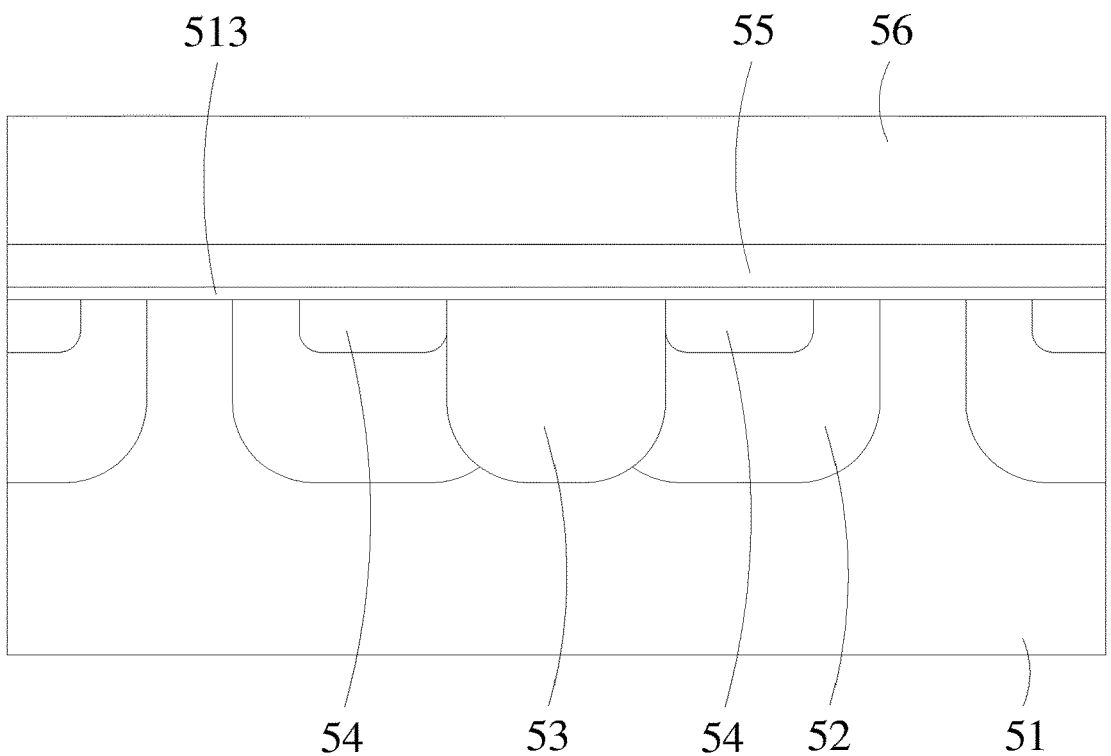

In FIG. 5E, the fabrication process removes the P-plus mask 93 and disposing a gate oxide layer 513 on the semiconductor substrate S by an oxidation process. The fabrication process disposes a polysilicon layer 55 and a dielectric layer 56, the polysilicon layer 55 is disposed on the gate oxide layer 513 and the dielectric layer 56 is disposed on the polysilicon layer 55. After forming the P-plus layer 53, the hard mask including the P-plus mask 93 is removed. An oxidation process and an anneal process can be conducted to the surface of the semiconductor substrate S. The anneal process may include a high temperature anneal process over 1500° C., for example at 1700° C. If the silicon carbide layer is disposed on the oxide layer, a backside process may be conducted to remove the oxide layer.

When the surface of the semiconductor substrate S is cleaned, the gate oxide layer 513 is thermally grown on the surface of the semiconductor substrate S and treated to reduce interface trap densities on interface between the gate oxide layer 513 and the surface of the semiconductor substrate S. After that, the polysilicon layer 55 is disposed on the semiconductor substrate S and the dielectric layer 56 is disposed on the polysilicon layer 55. The polysilicon layer 55 is formed by the poly deposition and the dielectric layer 56 is formed by the dielectric material deposition. The dielectric material may include oxide dielectric material, like silicon oxide.

Figure 5F:
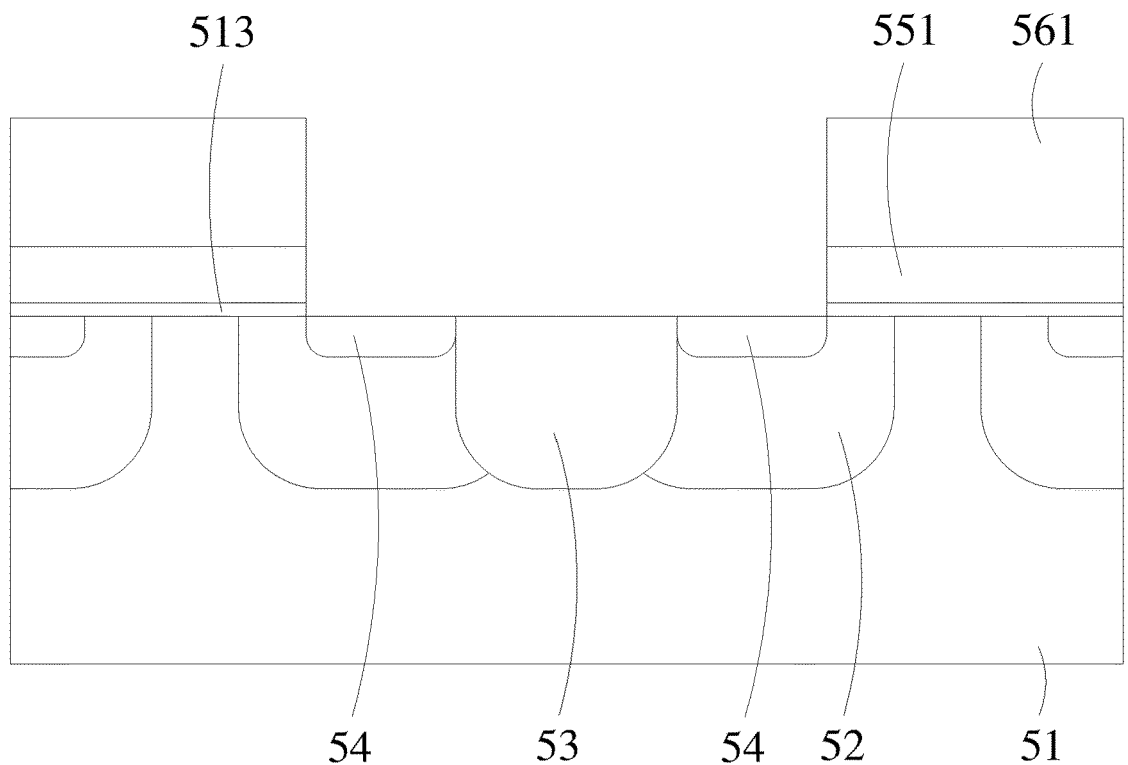

In FIG. 5F, the fabrication process etches the polysilicon layer 55 and the dielectric layer 56 to define a poly gate 551 and a first interlayer dielectric layer 561. In order to define the gate structure, the dielectric layer 56 and the polysilicon layer 55 are etched to define the patterned position of the poly gate 551. The poly gate 551 is disposed on partial area of the highly doped regions and is isolated form the highly doped regions by the gate oxide layer 513. The remained dielectric layer 56 may be the first interlayer dielectric layer 561 covering the top surface of the poly gate 551. The etching processes for forming the poly gate 551 and a first interlayer dielectric layer 561 may use the same mask. There is no need to provide a mask for defining the gate structure and another mask for forming the contact structure. Therefore, the numbers of the mask used in the fabrication process can be reduced.

Figure 5G:
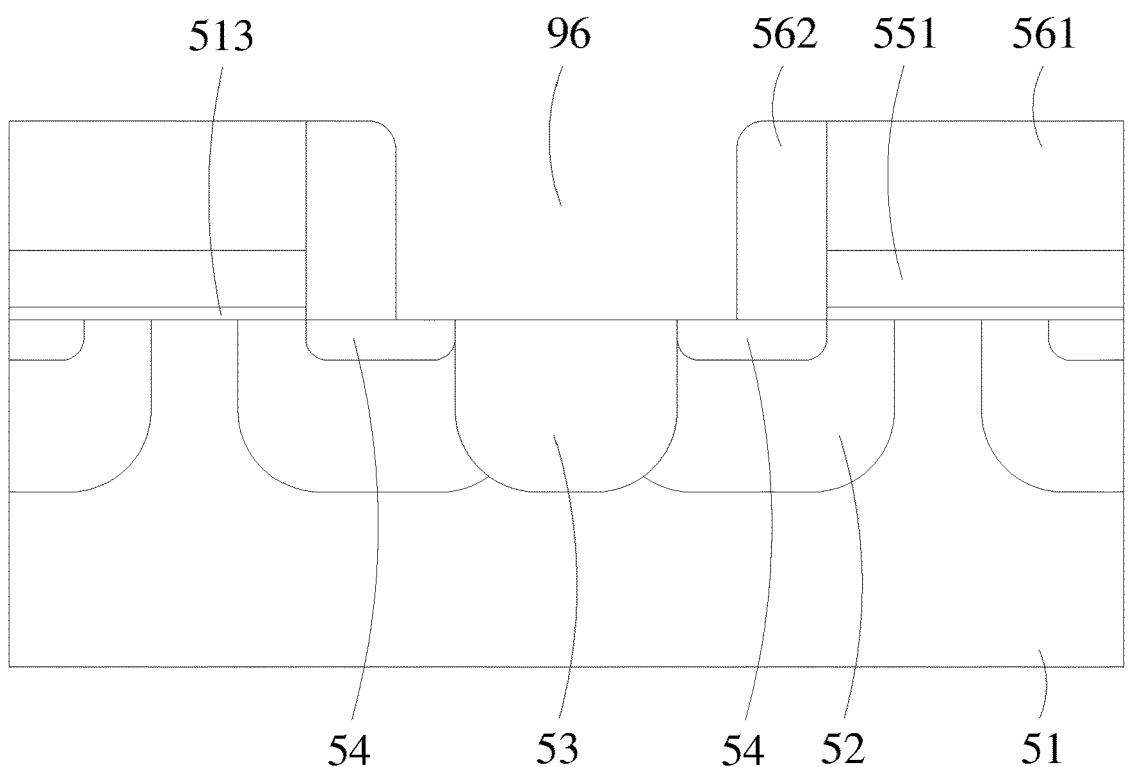

In FIG. 5G, the fabrication process disposes a second interlayer dielectric layer 562 on sidewall of the poly gate 551 and the first interlayer dielectric layer 561. Since the dielectric layer 56 and the polysilicon layer 55 are sequentially etched, the side surfaces of the poly gate 551 and the first interlayer dielectric layer 561 are exposed. To prevent contact with the poly gate 551, the second interlayer dielectric layer 562 is formed on the sidewall of the poly gate 551 and the first interlayer dielectric layer 561. The second interlayer dielectric layer 562 can be formed by the dielectric material deposition. The poly gate 551 is covered by the first interlayer dielectric layer 561 and the second interlayer dielectric layer 562.

In the present disclosure, the first interlayer dielectric layer 561 and the second interlayer dielectric layer 562 can be made by the different dielectric materials. For example, the first interlayer dielectric layer 561 may include oxide dielectric material and the second interlayer dielectric layer 562 may include nitride dielectric material. The different materials may have different etching rate. The reason of using different materials is to make sure that the thickness of the dielectric layer after the following etching process is still enough and the breakout route won't be occurred between the gate structure and the contact structure. However, the present disclosure is not restricted by the above material. In the other embodiment, the first interlayer dielectric layer 561 and the second interlayer dielectric layer 562 may use the same dielectric material, like silicon dioxide, silicon nitride or other dielectric material. The thickness of the dielectric layer can be achieved by controlling the etching time.

Figure 5H:
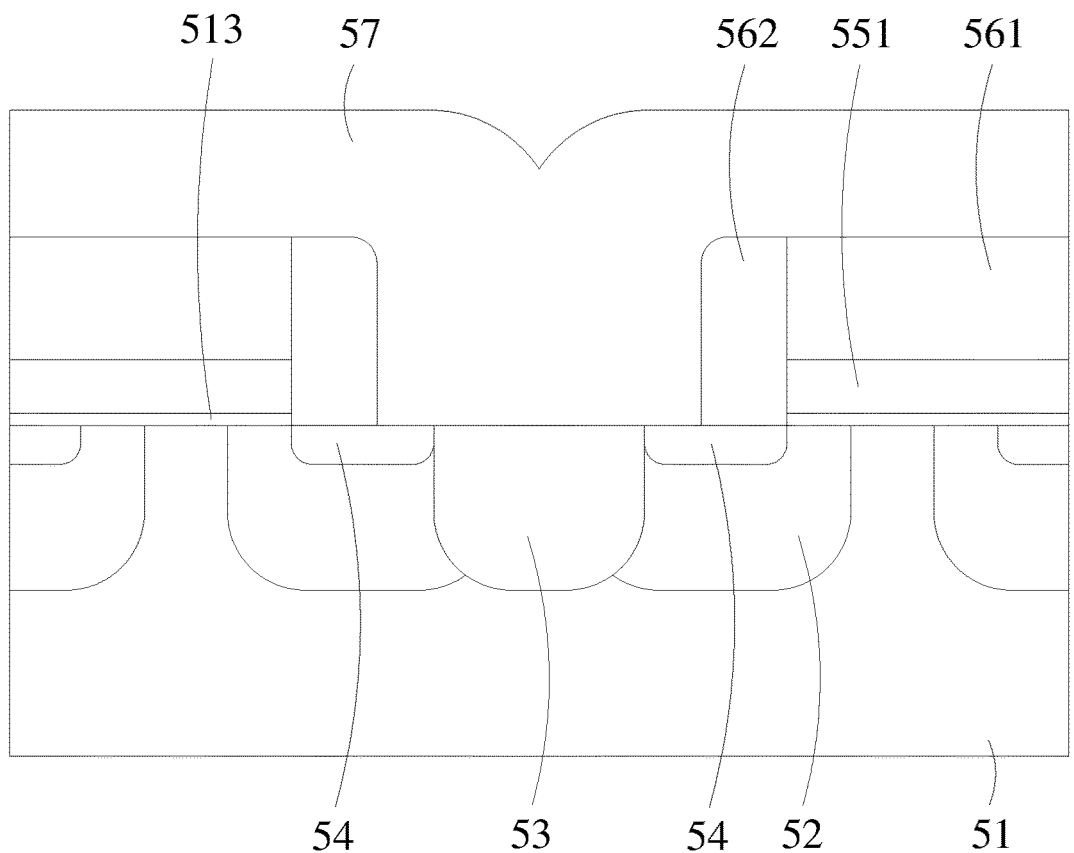

In FIG. 5H, the fabrication process disposes a metal layer 57 to cover the first interlayer dielectric layer 561 and the second interlayer dielectric layer 562. After forming the second interlayer dielectric layer 562, the conductive material is filled in the opening 96 and covered the dielectric layer to form the metal layer 57. The metal layer 57 contacts both the N-plus layer 54 and the P-plus layer 53 in the same plane.

FIG. 5H shows the schematic diagrams of the silicon carbide MOSFET in accordance with the fifth embodiment of the present disclosure. As shown in FIG. 5H, the silicon carbide MOSFET includes the silicon carbide layer 51, the P-well region 52, the P-plus layer 53, the N-plus layer 54, the gate oxide layer 513, the poly gate 551, the first interlayer dielectric layer 561, the second interlayer dielectric layer 562 and the metal layer 57. The P-well region 52 is disposed in the silicon carbide layer 51. The N-plus layer 54 is disposed within the P-well region 52. The P-plus layer 53 is disposed between the two N-plus layers 54. The P-plus layer 53 and the N-plus layer 54 are disposed on top surface of the silicon carbide layer 51. The poly gate 551 is disposed on the gate oxide layer 513 and the doped regions. That is, the poly gate 551 is overlapped on partial area of the P-well region 52.

The first interlayer dielectric layer 561 is disposed on the poly gate 551 and covers the top surface of the poly gate 551. The second interlayer dielectric layer 562 is disposed on side surface of the poly gate 551. The first interlayer dielectric layer 561 and the second interlayer dielectric layer 562 can be made by dielectric implant process. The materials used for forming the first interlayer dielectric layer 561 and the second interlayer dielectric layer 562 can be same or different. The opening is formed between the two second interlayer dielectric layers 562 and the opening exposes the P-plus layer 53. The metal layer 57 is disposed in the opening and the metal contact is able to reach both the P-plus layer 53 and the N-plus layer 54. The metal layer 57 is also disposed on the first interlayer dielectric layer 561 and the second interlayer dielectric layer 562. The metal layer 57 and the poly gate 551 are isolated by the first interlayer dielectric layer 561 and the second interlayer dielectric layer 562.

Please refer to FIG. 6A to FIG. 6I, which are the schematic diagrams of the fabrication process of forming the silicon carbide MOSFET in accordance with the sixth embodiment of the present disclosure. FIG. 6A to FIG. 6H show the section view of the MOSFET device.

Figure 6A:
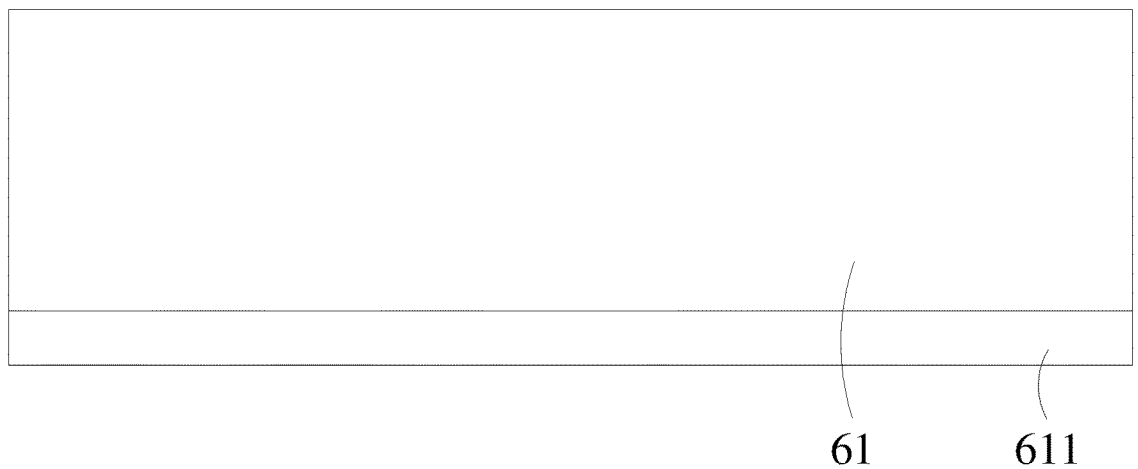
FIG. 6A to FIG. 6I are schematic diagrams of the fabrication process of forming the silicon carbide MOSFET in accordance with the sixth embodiment of the present disclosure.

In FIG. 6A, the fabrication process provides a semiconductor substrate S, the semiconductor substrate S having a silicon carbide layer 61 and the silicon carbide layer 61 is disposed on an oxide layer 611. A silicon wafer is provided. A photoresist can be used to define the alignment mark. The silicon carbide layer 61 is formed by a dry etching process and the photo resistor will be removed. The silicon carbide layer 61 may be an n-drift region.

Figure 6B:
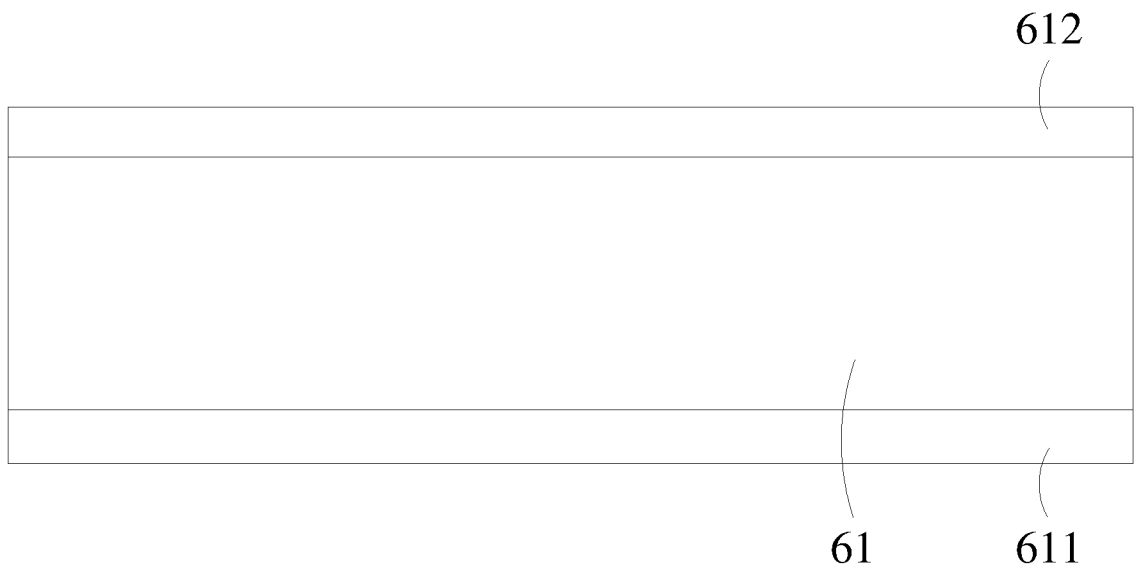

In FIG. 6B, the fabrication process forms a junction field effect transistor layer 612 on the silicon carbide layer 61. The all active are of the silicon carbide layer 61 is implanted by a JFET (junction field effect transistor) implant process. The oxide hard mask can be used to conduct the implant process. After removing the oxide hard mask, the junction field effect transistor layer 612 is formed on top surface of the silicon carbide layer 61.

Figure 6C:
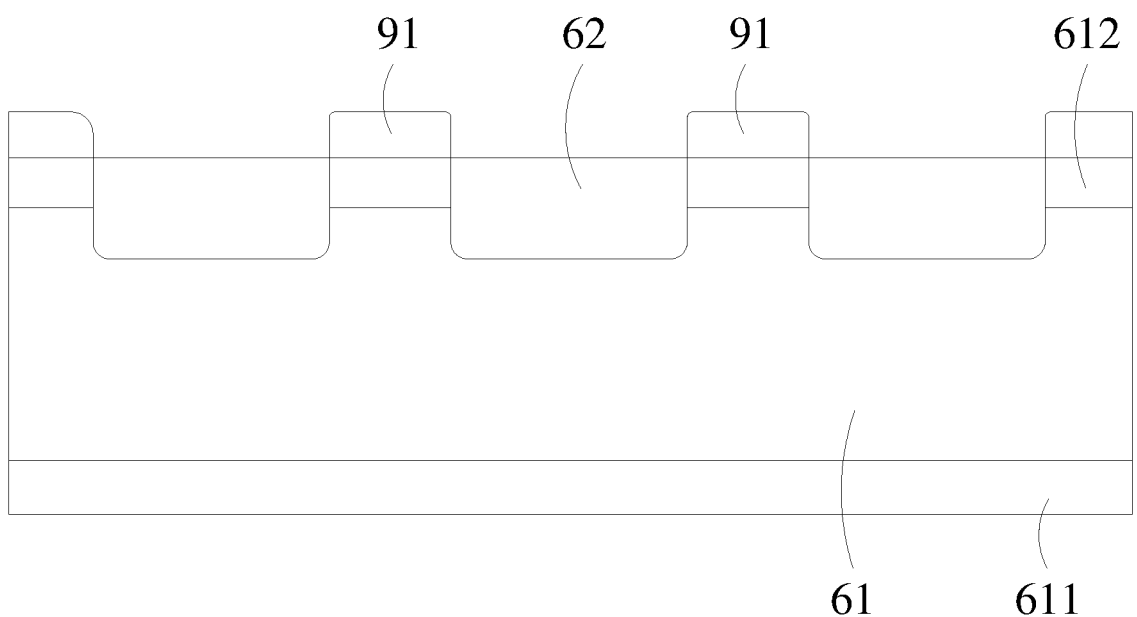

In FIG. 6C, the fabrication process provides a P-well mask 91 on the junction field effect transistor layer 612 and implants the semiconductor substrate S through the P-well mask 91 to form a P-well region 62. The P-well mask layer can be disposed on the junction field effect transistor layer 612. Etching the P-well mask layer through the photoresist to form the P-well mask 91. The P-well mask 91 is used to define the area of the implant region. The fabrication process implants the semiconductor substrate S to form the P-well region 62. That is, the junction field effect transistor layer 612 and the silicon carbide layer 61 defined by the P-well mask 91 are implanted by the dopants to form the P-well region 62.

Figure 6D:
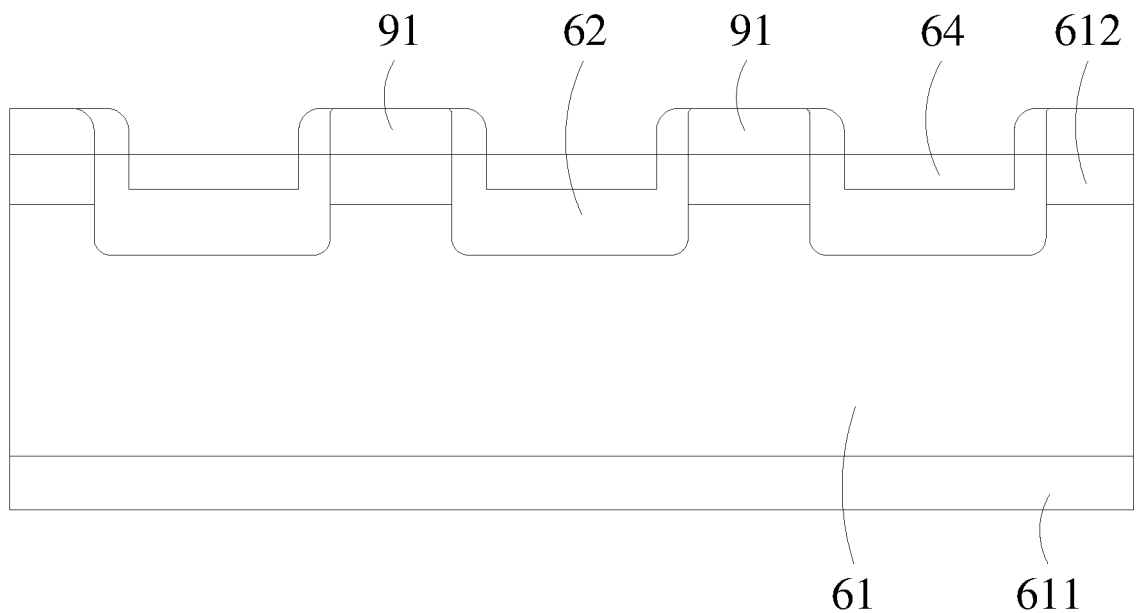

In FIG. 6D, the fabrication process disposes a spacer 92 on sidewall of the P-well mask 91 and implants the P-well region 62 through the spacer 92 to form an N-plus layer 64. After forming the P-well region 62, the next step is forming the highly doped regions. In the present disclosure, the spacers 92 are disposed on the sidewall of the p-well mask 91. These spacers 92 may be formed by a dielectric deposition process. For example, the dielectric material used in the deposition process may be silicon dioxide, silicon nitride ($Si_3N_4$), and so on. The spacers 92 cover the surrounding surface of the P-well region 62 and the exposed surface of the P-well region 62 may define the doped region. The N-plus ions are implanted into the P-well region 62 to form the N-plus layer 64. The N-plus layer 64 may be disposed within the P-well region 62.

Figure 6E:
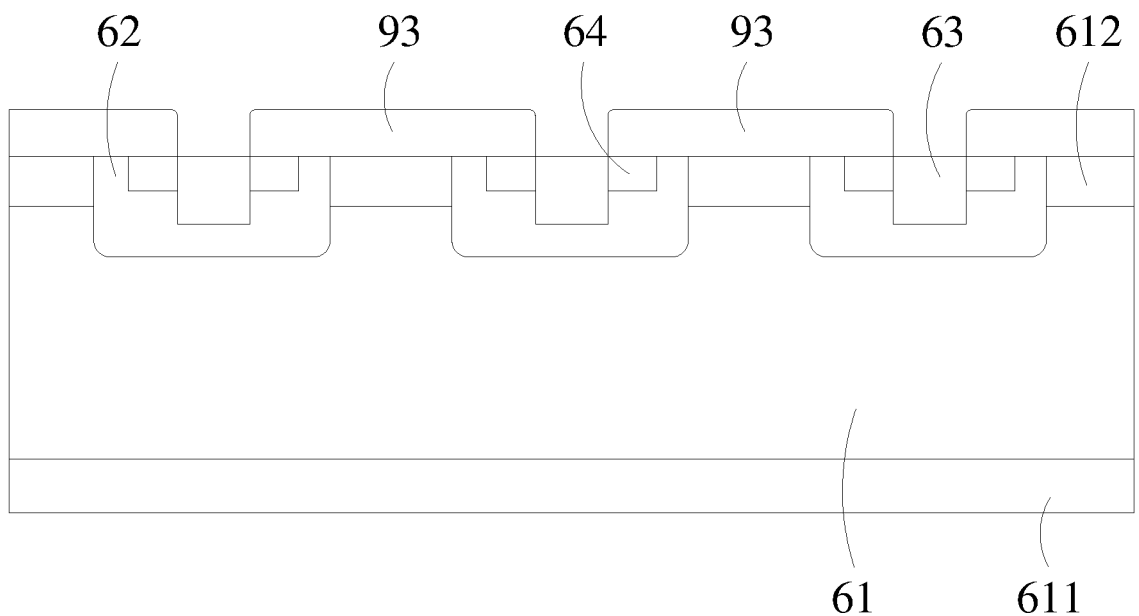

In FIG. 6E, the fabrication process removes the P-well mask 91 and the spacer 92. The fabrication process disposes a P-plus mask 93 on the semiconductor substrate S and implants semiconductor substrate S through the P-plus mask 93 to form a P-plus layer 63. The P-plus layer 63 is disposed between two N-plus layers 64. The hard masks including the P-well mask 91 and the spacer 92 are removed in this step. In order to define the P-plus region, the P-plus mask 93 is disposed on the semiconductor substrate S. In the present disclosure, the P-plus mask 93 can be formed on the P-well region 62 and the N-plus layer 64. The P-plus ions are implanted through the P-plus mask 93 to form the P-plus layer 63. The P-plus layer 63 is located between two N-plus layers 64. Using the P-plus mask 93 may provide a side by side structure for the two doped regions. The contact structure made in the following process may contact the both doped regions in the same plane.

Figure 6F:
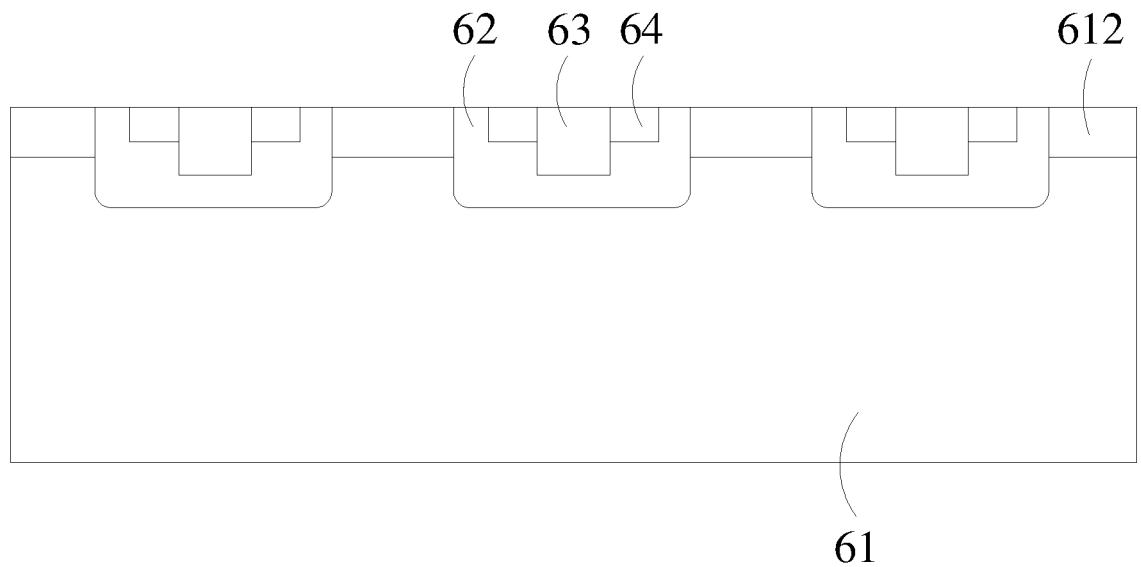

In FIG. 6F, the fabrication process removes the P-plus mask 93 and conducting a backside process to remove the oxide layer 611. After forming the P-plus layer 13, the hard mask including the P-plus mask 93 is removed. The backside process and an anneal process can be conducted to the surface of the semiconductor substrate S. The anneal process may include a high temperature anneal process over 1500° C. The backside process is conducted to remove the oxide layer 611.

Figure 6G:
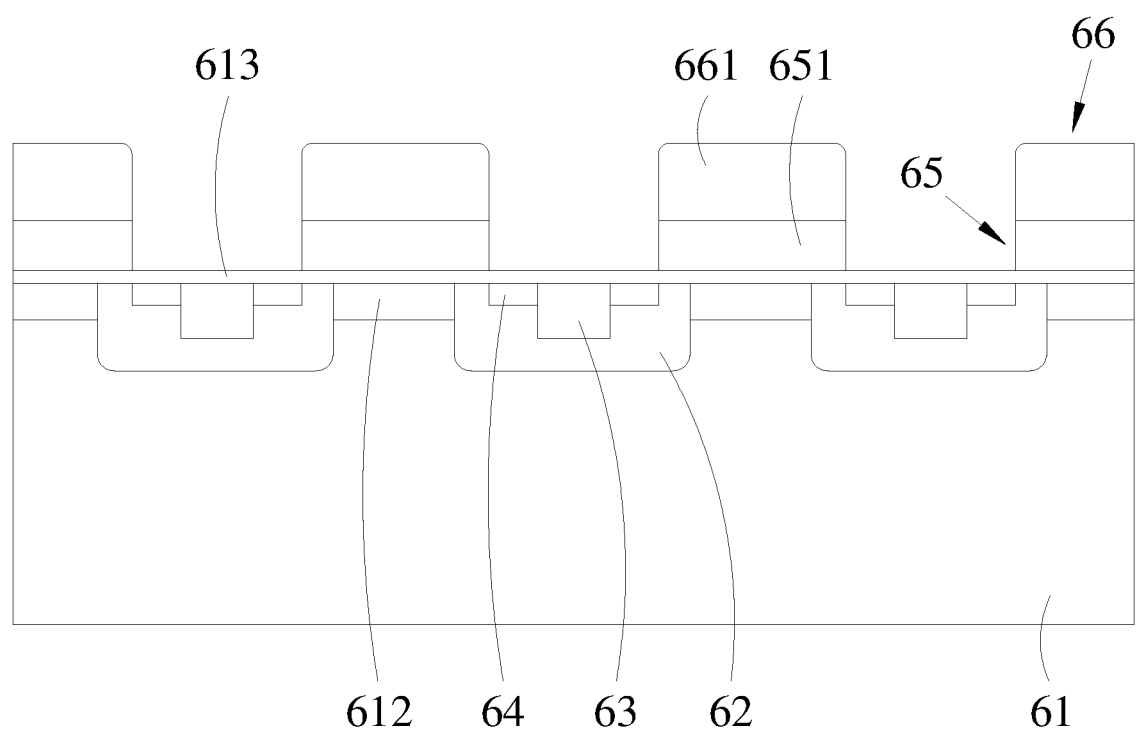

In FIG. 6G, the fabrication process disposes a gate oxide layer 613, a polysilicon layer 65 and a dielectric layer 66, the gate oxide layer 613 is disposed on the semiconductor substrate S, the polysilicon layer 65 is disposed on the gate oxide layer 613 and the dielectric layer 66 is disposed on the polysilicon layer 65. The polysilicon layer 65 and the dielectric layer 66 are etched to define a poly gate 651 and a first interlayer dielectric layer 661. When the surface of the semiconductor substrate S is cleaned, the gate oxide layer 613 is disposed on the top surface of the semiconductor substrate S and the gate oxide layer 613 covers the P-well region 62 and the highly doped regions including the P-plus layer 63 and the N-plus layer 64. The polysilicon layer 65 is disposed on the gate oxide layer 613 and the dielectric layer 66 is disposed on the polysilicon layer 65. The gate oxide layer 613 is formed by the oxidation process. The polysilicon layer 65 is formed by the poly deposition and the dielectric layer 66 is formed by the dielectric material deposition. The dielectric material may include oxide dielectric material, like silicon oxide.

In order to define the gate structure, the dielectric layer 66 and the polysilicon layer 65 are etched to define the patterned position of the poly gate 651. The poly gate 651 is disposed on partial area of the highly doped regions and is isolated form the highly doped regions by the gate oxide layer 613. The remained dielectric layer 66 may be the first interlayer dielectric layer 661 covering the top surface of the poly gate 651. The etching processes for forming the poly gate 651 and a first interlayer dielectric layer 661 may use the same mask. There is no need to provide a mask for defining the gate structure and another mask for forming the contact structure. Therefore, the numbers of the mask used in the fabrication process can be reduced.

Figure 6H:
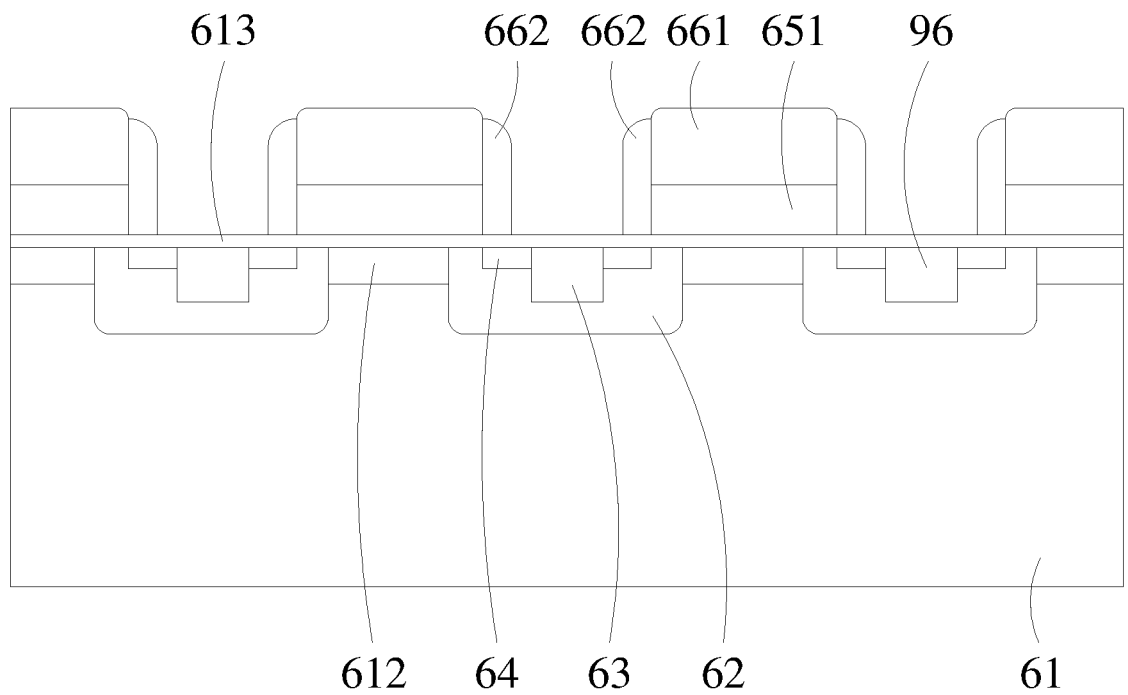

In FIG. 6H, the fabrication process disposes a second interlayer dielectric layer 662 on sidewall of the poly gate 651 and the first interlayer dielectric layer 661. The side surfaces of the poly gate 651 and the first interlayer dielectric layer 661 are exposed. To prevent contact with the poly gate 651, the second interlayer dielectric layer 662 is formed on the sidewall of the poly gate 651 and the first interlayer dielectric layer 661. The second interlayer dielectric layer 662 can be formed by the dielectric material deposition. The poly gate 651 is covered by the first interlayer dielectric layer 661 and the second interlayer dielectric layer 662.

In the present disclosure, the first interlayer dielectric layer 661 and the second interlayer dielectric layer 662 can be made by the different dielectric materials. For example, the first interlayer dielectric layer 661 may include oxide dielectric material and the second interlayer dielectric layer 662 may include nitride dielectric material. The different materials may have different etching rate. The reason of using different materials is to make sure that the thickness of the dielectric layer after the following etching process is still enough and the breakout route won't be occurred between the gate structure and the contact structure. However, the present disclosure is not restricted by the above material. In the other embodiment, the first interlayer dielectric layer 661 and the second interlayer dielectric layer 662 may use the same dielectric material, like silicon dioxide, silicon nitride or other dielectric material. The thickness of the dielectric layer can be achieved by controlling the etching time.

Figure 6I:
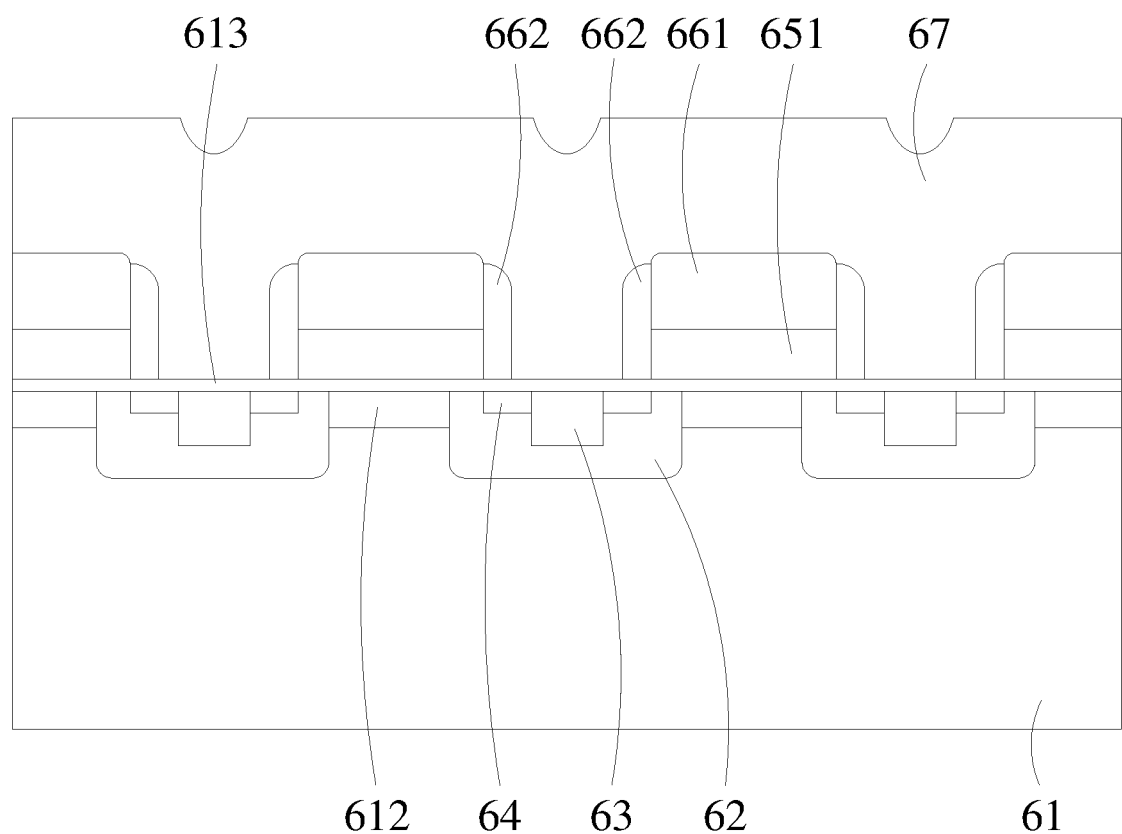

In FIG. 6I, the fabrication process disposes a metal layer 67, and the metal layer 67 covers the opening 96, the first interlayer dielectric layer 661 and the second interlayer dielectric layer 662. The contact structure must contact both the P-plus region and the N-plus region. Since the N-plus layer 24 and the P-plus layer 23 are disposed in the same plane, there is no need to conduct another etching process for exposing the doped region. After forming second interlayer dielectric layer 662, the conductive material is filled in the opening 94 and covered the dielectric layer to form the metal layer 67. The metal layer 67 overlaps both the N-plus layer 64 and the P-plus layer 63. The poly gate 651 is covered by the first interlayer dielectric layer 661 and the second interlayer dielectric layer 662. Thus, the poly gate 651 is isolated from the metal layer 67. A passivation deposition process may be conducted after disposing the metal layer 67.

FIG. 6I shows the schematic diagrams of the silicon carbide MOSFET in accordance with the sixth embodiment of the present disclosure. As shown in FIG. 6I, the silicon carbide MOSFET includes the silicon carbide layer 61, the P-well region 62, the P-plus layer 63, the N-plus layer 64, the gate oxide layer 613, the poly gate 651, the first interlayer dielectric layer 661, the second interlayer dielectric layer 662 and the metal layer 67. The P-well region 62 is disposed in the silicon carbide layer 61. The P-plus layer 63 between the two N-plus layers 64. The P-plus layer 63 and the N-plus layer 64 are disposed on the top surface of the silicon carbide layer 61 and are disposed within the P-well region 62. The gate oxide layer 613 is disposed on the silicon carbide layer 61 and the doped regions. The poly gate 651 is disposed on the gate oxide layer 613. The poly gate 651 is overlapped on partial area of the P-well region 62.

The first interlayer dielectric layer 661 is disposed on the poly gate 651 and covers the top surface of the poly gate 651. The second interlayer dielectric layer 662 is disposed on side surface of the poly gate 651. The first interlayer dielectric layer 661 and the second interlayer dielectric layer 662 can be made by different dielectric materials. The opening is formed between the two second interlayer dielectric layers 662 and the opening exposes the P-plus layer 63 and the N-plus layer 64. The metal layer 67 is disposed in the opening and the metal contact is able to reach both the P-plus layer 63 and the N-plus layer 64. The metal layer 67 is also disposed on the first interlayer dielectric layer 661 and the second interlayer dielectric layer 662. The metal layer 67 and the poly gate 651 are isolated by the first interlayer dielectric layer 661 and the second interlayer dielectric layer 662.

In the fabrication process of forming the silicon carbide MOSFET, the total number of mask layers may be reduced. That is, the mask for forming the opening between the dielectric layers. The fabrication process does not need a new mask to form the proposed device. The manufacturing cost can be saved. In addition, the minimum pitch size can be reduced based on the saving of the mask layers. Therefore, the electrical properties of the semiconductor device can be improved.

The present disclosure disclosed herein has been described by means of specific embodiments. However, numerous modifications, variations and enhancements can be made thereto without departing from the spirit and scope of the disclosure set forth in the claims.

What is claimed is:

1. A fabrication method of forming a silicon carbide MOSFET, the fabrication method comprising:
    providing a semiconductor substrate, the semiconductor substrate having a silicon carbide layer;
    providing a P-well mask on the semiconductor substrate and implanting the semiconductor substrate through the P-well mask to form a P-well region;
    disposing a spacer on sidewall of the P-well mask and implanting N-plus ions at the P-well region through the spacer to form an N-plus layer;
    removing the P-well mask and the spacer;
    disposing a P-plus mask on the semiconductor substrate and implanting P-plus ions through the P-plus mask to form a P-plus layer, the P-plus layer being disposed between the two N-plus layers;
    removing the P-plus mask and disposing a gate oxide layer on the semiconductor substrate by an oxidation process;
    disposing a polysilicon layer and a dielectric layer, the polysilicon layer being disposed on the gate oxide layer and the dielectric layer being disposed on the polysilicon layer;
    etching the polysilicon layer and the dielectric layer by using the same mask to define a poly gate and a first interlayer dielectric layer;
    disposing a second interlayer dielectric layer on sidewall of the poly gate and the first interlayer dielectric layer and the second interlayer dielectric layer being formed by dielectric material deposition, the first interlayer dielectric layer comprising oxide dielectric material and the second interlayer dielectric layer comprising nitride dielectric material;
    defining an opening between each two second interlayer dielectric layers by a dry etching process, the opening exposes the P-plus layer and a portion of the two N-plus layer adjacent to the P-plus layer;
    disposing a metal layer to fill the opening and to cover the first interlayer dielectric layer and the second interlayer dielectric layer, the poly gate being isolated from the metal layer by the first interlayer dielectric layer and the second interlayer dielectric layer, the metal layer contacts both the N-plus layer and the P-plus layer in same plane.

2. The fabrication method of claim 1, wherein a junction field effect transistor layer is formed on the silicon carbide layer by a junction field effect transistor implant.

3. The fabrication method of claim 1, wherein a P-well mask layer is disposed on the silicon carbide layer and the P-well mask layer is etched to form the P-well mask.

4. The fabrication method of claim 1, wherein the metal layer contacts both the N-plus layer and the P-plus layer in a same plane.

5. The fabrication method of claim 1, wherein the P-plus layer and the N-plus layer are disposed within the P-well region.

6. The fabrication method of claim 1, wherein the silicon carbide layer is disposed on an oxide layer.

7. The fabrication method of claim 5, wherein a backside process is conducted to remove the oxide layer after removing the P-well mask and the spacer.

8. The fabrication method of claim 1, wherein an anneal process is conducted after every implant process.

9. The fabrication method of claim 1, wherein a passivation deposition process is conducted after disposing a metal layer.

* * * * *